United States Patent
Kariyada et al.

(10) Patent No.: US 9,065,041 B2
(45) Date of Patent: Jun. 23, 2015

(54) MAGNETIC MEMORY CELL AND METHOD OF MANUFACTURING THE SAME

(71) Applicant: Renesas Electronics Corporation, Kawasaki-shi, Kanagwa (JP)

(72) Inventors: Eiji Kariyada, Kanagawa (JP); Katsumi Suemitsu, Kanagwa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 13/752,210

(22) Filed: Jan. 28, 2013

(65) Prior Publication Data
US 2013/0234268 A1 Sep. 12, 2013

(30) Foreign Application Priority Data
Mar. 8, 2012 (JP) ................................. 2012-052070

(51) Int. Cl.
| H01L 21/44 | (2006.01) |
| H01L 29/72 | (2006.01) |
| H01L 43/10 | (2006.01) |
| H01L 43/14 | (2006.01) |
| H01L 43/08 | (2006.01) |
| H01L 43/12 | (2006.01) |

(52) U.S. Cl.
CPC .............. *H01L 43/10* (2013.01); *H01L 43/14* (2013.01); *H01L 43/08* (2013.01); *H01L 43/12* (2013.01)

(58) Field of Classification Search
CPC ......... H01L 21/44; H01L 29/72; H01L 29/82; H01L 21/02
USPC .................. 257/E21.665, E21.643, E31.029, 257/421–427, E27.005, E43.001, E43.006, 257/20, 414, E29.323; 438/608, 3, 95, 157; 365/157, 158, 48, 55, 62, 66, 74, 78, 365/80–93, 100
See application file for complete search history.

(56) References Cited

U.S. PATENT DOCUMENTS

| 2003/0151859 A1* | 8/2003 | Hayashi et al. ............. 360/324.2 |
| 2011/0059557 A1* | 3/2011 | Yamagishi et al. ............... 438/3 |
| 2011/0298067 A1* | 12/2011 | Ishiwata et al. ............... 257/421 |
| 2012/0063221 A1* | 3/2012 | Yamane et al. ................ 365/173 |

OTHER PUBLICATIONS

Djayaprawira, et al,"230% room-temperature magnetoresistance in CoFeB/MgO/CoFeB magnetic tunnel junctions", Applied Physics Letters, 86, 092502, pp. 092502-1 to 092502-3, 2005.

* cited by examiner

*Primary Examiner* — David Vu
*Assistant Examiner* — Mouloucoulaye Inoussa
(74) *Attorney, Agent, or Firm* — McGinn IP Law Group, PLLC

(57) ABSTRACT

The present invention suppresses short circuits of a magnetic memory cell and a deterioration of the characteristics of a magnetic layer. A magnetic memory cell includes: a data storage layer; a tunnel barrier layer formed on the data storage layer; a reference layer formed on the tunnel barrier layer so as to cover a part of the tunnel barrier layer; and a metallic oxide layer formed on the tunnel barrier layer without covering the reference layer. The metallic oxide layer contains an oxide of a material of a contact part of the reference layer with the tunnel barrier layer.

11 Claims, 31 Drawing Sheets

FIG. 9

COMPARISON OF SHORT CIRCUIT INCIDENCES (%)

| WAFER NO. | ENDPOINT IN REFERENCE LAYER (EMBODIMENT) | WAFER NO. | ENDPOINT AT MgO (COMPARATIVE EXAMPLE) |
|---|---|---|---|
| #1 | 3.5 | #7 | 98.8 |
| #2 | 2.1 | #8 | 97.6 |
| #3 | 1.3 | #9 | 95.2 |
| #4 | 1.5 | #10 | 98.7 |
| #5 | 2.5 | #11 | 99.5 |
| #6 | 1.3 | #12 | 96.2 |

MAGNETIC MEMORY CELL AND METHOD OF MANUFACTURING THE SAME

CROSS-REFERENCE TO RELATED APPLICATIONS

The disclosure of Japanese Patent Application No. 2012-052070 filed on Mar. 8, 2012 including the specification, drawings and abstract is incorporated herein by reference in its entirety.

The present invention relates to a magnetic memory cell and a method of manufacturing the same, and particularly relates to a magnetic memory cell including a magnetic tunnel junction and a method of manufacturing the same.

BACKGROUND

In a magnetic memory, e.g., a magnetic random access memory (MRAM), a magnetoresistance element is used as a magnetic memory cell that magnetically stores data. A typical magnetoresistance element has a magnetic tunnel junction (MTJ) where a tunnel barrier layer is interposed between two magnetic layers.

In some magnetic memory cells, the upper one of two magnetic layers covers only a part of a tunnel barrier layer, that is, the upper magnetic layer is formed into an island shape.

The formation of a magnetic memory cell having such a structure is disadvantageous because etching of an upper magnetic layer to be formed into an island shape is actually difficult to stop right on the surface of a tunnel barrier layer. For example, in order to prevent a magnetic layer from remaining on the tunnel barrier layer, over-etching is necessary. However, over-etching may form a trench penetrating the tunnel barrier layer, causing a short circuit in the magnetic memory cell.

Furthermore, the lower magnetic layer is only covered with the thin tunnel barrier layer, particularly in the final step of etching of the magnetic layer, causing plasma damage to the tunnel barrier layer and the lower magnetic layer. Therefore, the characteristics of the lower magnetic layer may deteriorate.

SUMMARY

As described above, in the structure of the magnetic memory cell and the method of manufacturing the same according to the related art, short circuits may occur in the magnetic memory cell or the characteristics of the magnetic layer may deteriorate.

Other problems and new features will become apparent in the description and the accompanying drawings of the specification.

According to an embodiment, a magnetic memory cell includes: a first magnetic layer; a tunnel barrier layer formed over the first magnetic layer; a second magnetic layer formed over the tunnel barrier layer so as to partially cover the tunnel barrier layer; and a metallic oxide layer formed over the tunnel barrier layer without covering the second magnetic layer. The metallic oxide layer contains an oxide of a material of a contact part of the second magnetic layer with the tunnel barrier layer.

Such a magnetic memory cell is preferably used for a magnetic random access memory.

According to another embodiment, a method of manufacturing a magnetic memory cell includes the steps of: forming a tunnel barrier layer over a first magnetic layer; forming a second magnetic layer over the tunnel barrier layer; forming a mask over the second magnetic layer; etching an unmasked part of the second magnetic layer to an intermediate position of the second magnetic layer in a thickness direction of the second magnetic layer; and forming a metallic oxide layer by oxidizing an unetched part of the unmasked part of the second magnetic layer.

These embodiments make it possible to suppress short circuits in a magnetic memory cell and deterioration of characteristics of a magnetic layer.

BRIEF DESCRIPTION OF THE DRAWINGS

FIG. 9 is a table showing the ratio of short circuit incidences in memory cells after etching with an endpoint set at a point in the reference layer and the ratio of short circuit incidences in a magnetic memory cell after etching with an endpoint set at the top surface of a MgO layer;

DETAILED DESCRIPTION

Figure 1A:
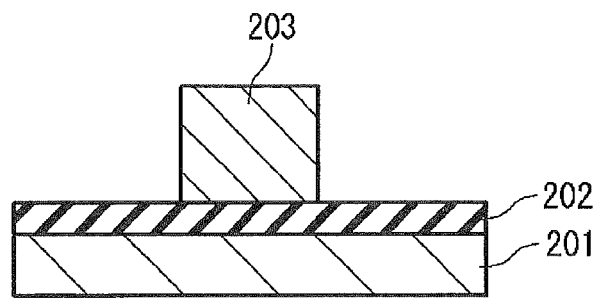
FIG. 1A is a cross-sectional view illustrating an example of the structure of a magnetic memory cell.

In order to further clarify the technical significance of a magnetic memory cell and a method of manufacturing the same according to an embodiment, problems caused by the island shape of upper one of two magnetic layers will be more specifically described below. FIG. 1A illustrates an example of a magnetic memory cell configured thus. A tunnel barrier layer 202 is formed on a magnetic layer 201, and a magnetic layer 203 is formed on the tunnel barrier layer 202. The magnetic layer 203 only covers a part of the tunnel barrier layer 202.

The magnetic memory cell configured as illustrated in FIG. 1A is formed as follows: a laminated body including the magnetic layer 201, the tunnel barrier layer 202, and the magnetic layer 203 is formed, and then the magnetic layer 203 is patterned by etching. Typical etching of the magnetic layer 203 stops at the surface of the tunnel barrier layer 202.

Figure 1B:
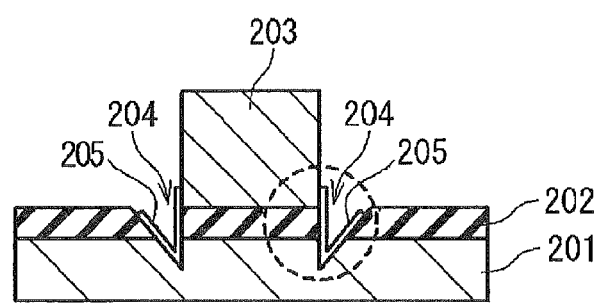
FIG. 1B is a cross-sectional view illustrating a short circuit in the formation of the magnetic memory cell configured as illustrated in FIG. 1A.

Unfortunately, the structure of the magnetic memory cell in FIG. 1A has two problems: first, short circuits may occur between the magnetic layers 201 and 203 because it is actually difficult to completely stop etching of the magnetic layer 203 at the surface of the tunnel barrier layer 202. Over-etching is necessary for preventing the magnetic layer 203 from remaining on the tunnel barrier layer 202. However, as illustrated in FIG. 1B, trenches 204 penetrating the tunnel barrier layer 202 may be formed near the end of the magnetic layer 201 by over-etching. In an etching process, a re-deposited material layer 205 containing the materials of the tunnel barrier layer 202 and the magnetic layer 203 may be formed on the inner surface of the trench 204, which may cause short circuits between the magnetic layer 201 and the magnetic layer 203. Short circuits between the magnetic layer 201 and the magnetic layer 203 deactivate the memory cell.

Secondly, the characteristics of the magnetic layer 201 may be deteriorated. This is because the magnetic layer 201 only covered with the thin tunnel barrier layer 202 may be subjected to plasma damage, particularly in the final step of the etching process of the magnetic layer 203.

The characteristics of the magnetic layer 201 seriously deteriorate particularly when the magnetic layers 201 and 203 are made of materials having perpendicular magnetic anisotropy and the tunnel barrier layer 202 is a MgO film. It is known that an excellent MR ratio is used when the magnetic layers 201 and 203 are made of materials having perpendicular magnetic anisotropy and the tunnel barrier layer 202 is a MgO film. In this case, when the magnetic layer 203 is etched to the top surface of the tunnel barrier layer 202 (MgO layer), the perpendicular magnetic anisotropy of the magnetic layer 201 may be deteriorated or lost. The inventors have examined this phenomenon as follows:

First, it is known that in the case where the material of the magnetic layer 201 is a Co/Ni laminated film (a laminate body of thin Co films and Ni films), the origin of the perpendicular magnetic anisotropy lies on the interface between the Co film and the Ni film. In the Co/Ni laminated film having perpendicular magnetic anisotropy, the Co films and Ni films are grown by fcc(111) orientation. In the case of etching with an endpoint set on the top surface of the tunnel barrier layer 202 (MgO film). The laminated structure of the Co films and the Ni films is disturbed through the tunnel barrier layer 202 by the influence of plasma during etching, deviating the laminated structure from the ideal fcc(111) orientation. The inventors have estimated that the deviation causes a reduction in the perpendicular magnetic anisotropy of the Co/Ni laminated film.

In the case where the material of the magnetic layer 201 is a CoFeB film and the tunnel barrier layer 202 is a MgO film, the origin of the perpendicular magnetic anisotropy of the magnetic layer 201 lies on the interface between the CoFeB film and the MgO film. Specifically, the CoFeB film and the MgO film are amorphous immediately after deposition. The MgO film is oriented to bcc(100) by heat treatment after deposition. Accordingly, the CoFeB film is also oriented so as to have perpendicular magnetic anisotropy. However, in the case where the endpoint of etching is set at the top surface of the tunnel barrier layer 202 (MgO film) before etching, the interface between the CoFeB film and the MgO film is disturbed. Thus, heat treatment cannot ideally orient the MgO film to bcc(100). The inventors have found that the unsatisfactory orientation hampers the perpendicular magnetic anisotropy of the CoFeB film.

In a structure where the magnetic layers 201 and 203 are made of materials having perpendicular magnetic anisotropy and the tunnel barrier layer 202 is a MgO film, the endpoint of etching is set at the top surface of the tunnel barrier layer 202 during the etching of the magnetic layer 203. In this case, the perpendicular magnetic anisotropy of the magnetic layer 201 deteriorates or disappears so as to interfere with the intended performance of a magnetic tunnel junction. In the case where variations in process parameter cause etching into the tunnel barrier layer 202, the orientation of the film is more seriously affected, so that the perpendicular magnetic anisotropy of the magnetic layer 201 may completely disappear or magnetization may be lost according to an experimental observation.

The structure of a magnetic memory cell and a method of manufacturing the same according to the present embodiment have been devised to solve the problem and effectively suppress short circuits in a magnetic memory cell and deteriorated characteristics of a magnetic layer. The structure of the magnetic memory cell and the method of manufacturing the same according to the present embodiment will be specifically described below.

Figure 2:
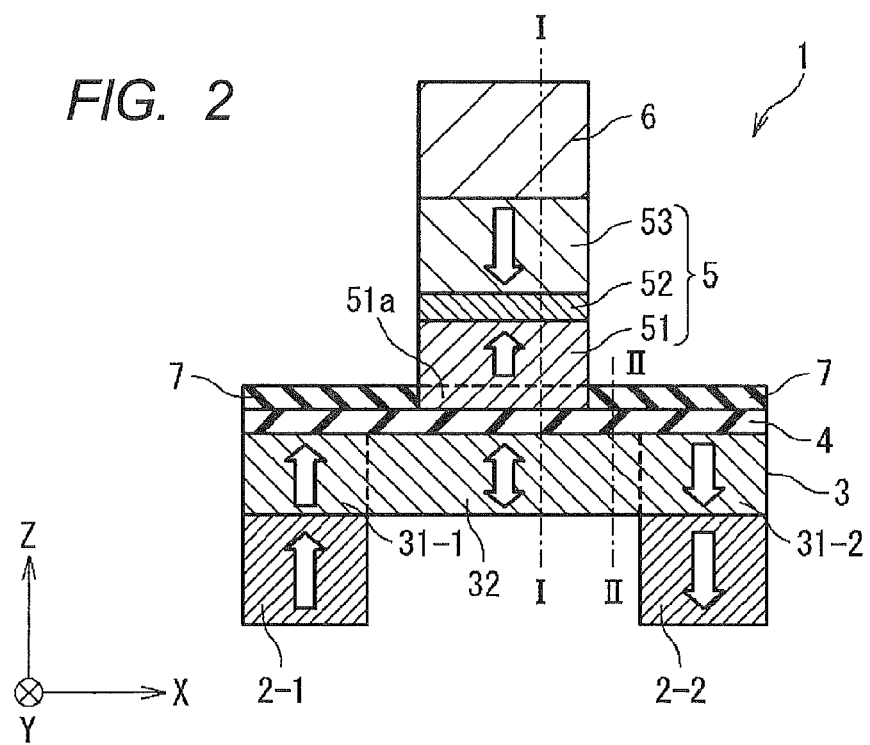
FIG. 2 is a cross-sectional view illustrating the structure of a magnetic memory cell according to an embodiment.

FIG. 2 is a cross-sectional view illustrating the structure of a magnetic memory cell 1 according to the present embodiment. The magnetic memory cell 1 is a magnetic memory cell of so-called domain wall displacement. The magnetic memory cell 1 includes a fixed magnetization layers 2-1 and 2-2, a data storage layer 3, a tunnel barrier layer 4, a reference layer 5, and a cap layer 6. In the following explanation, the layers of the magnetic memory cell 1 are stacked in a Z direction, and a plane perpendicular to the Z direction is defined as an XY plane.

The fixed magnetization layers 2-1 and 2-2 have fixed magnetization. The fixed magnetization layers 2-1 and 2-2 are made of ferromagnetic materials that are magnetically hard and have perpendicular magnetic anisotropy. The magnetization of the fixed magnetization layers 2-1 and 2-2 is fixed in antiparallel directions (opposite directions). In the present embodiment, the magnetization of the fixed magnetization layer 2-1 is fixed in the +Z direction (upward) while the magnetization of the fixed magnetization layer 2-2 is fixed in a –Z direction (downward). The fixed magnetization layers 2-1 and 2-2 have the function of partially fixing the magnetization of the data storage layer 3 with switched connection or magnetostatic coupling.

The data storage layer 3 that stores data as directions of magnetization is formed on the fixed magnetization layers 2-1 and 2-2. The data storage layer 3 is magnetically soft and has perpendicular magnetic anisotropy. On the data storage layer 3, the magnetization of a part joined to the fixed magnetization layer 2-1 (hereinafter, will be called "fixed magnetization area 31-1") is fixed in the same direction as the magnetization of the fixed magnetization layer 2-1 while the magnetization of a part joined to the fixed magnetization layer 2-2 (hereinafter, will be called "fixed magnetization area 31-2") is fixed in the same direction as the magnetization of the fixed magnetization layer 2-2. In other words, in the present embodiment, the magnetization of the fixed magnetization area 31-1 is fixed in a +Z direction while the magnetization of the fixed magnetization area 31-2 is fixed in the +Z direction. Furthermore, the magnetization of a part of the data storage layer 3 between the fixed magnetization areas 31-1 and 31-2 (hereinafter called "reversed magnetization area 32") can be reversed between the +Z direction and a –Z direction. The direction of magnetization of the reversed magnetization area 32 is associated with data. For example, the reversed magnetization area 32 magnetized in the –Z direction (downward) is associated with data "1" while the reversed magnetization area 32 magnetized in the +Z direction (upward) is associated with data "0".

The tunnel barrier layer 4 is a thin non-magnetic insulating film formed over the top surface of the data storage layer 3. In the present embodiment, the tunnel barrier layer 4 is a MgO layer.

The reference layer 5 has fixed magnetization and is formed over a part of the top surface of the tunnel barrier layer 4. The reference layer 5 includes a first ferromagnetic layer 51, a non-magnetic layer 52, and a second ferromagnetic layer 53. The first ferromagnetic layer 51 and the second ferromagnetic layer 53 are both magnetically hard and have perpendicular magnetic anisotropy. The non-magnetic layer 52 is a non-magnetic metallic layer that antiferromagnetically couples the first ferromagnetic layer 51 and the second ferromagnetic layer 53. Since the first ferromagnetic layer 51 and the second ferromagnetic layer 53 are antiferromagnetically coupled to each other, the magnetization of the first ferromagnetic layer 51 and the magnetization of the second ferromagnetic layer 53 are fixed in opposite directions. In the present embodiment, the magnetization of the first ferromagnetic layer 51 is fixed in the +Z direction (upward) while the magnetization of the second ferromagnetic layer 53 is fixed in the –Z direction (upward).

The cap layer 6 is a metal layer covering the reference layer 5 to protect the reference layer 5.

The metallic oxide layer 7 covers the top surface of the tunnel barrier layer 4 without covering the reference layer 5. The metallic oxide layer 7 is made of a metallic oxide. As will be described later, the metallic oxide layer 7 containing an oxide of a material of a part of the first ferromagnetic layer 51 (a part denoted as 51a in FIG. 2) is formed in a manufacturing process. The structures and the forming method of the data storage layer 3, the tunnel barrier layer 4, the reference layer 5, the cap layer 6, and the metallic oxide layer 7 will be specifically described later.

The reversed magnetization area 32 of the data storage layer 3, the tunnel barrier layer 4, and the first ferromagnetic layer 51 of the reference layer 5 form a magnetic tunnel junction. The resistance value of the magnetic tunnel junction varies depending upon the relative directions of the magnetization of the reversed magnetization area 32 and the first ferromagnetic layer 51 of the reference layer 5. In the case where the reversed magnetization area 32 of the data storage layer 3 is oriented in the same direction +Z direction (upward) as the first ferromagnetic layer 51 of the reference layer 5, the resistance of the magnetic tunnel junction relatively decreases. In the case where the reversed magnetization area 32 of the data storage layer 3 is oriented in the –Z direction (downward) opposite to the first ferromagnetic layer 51 of the reference layer 5, the resistance of the magnetic tunnel junction relatively increases.

Figure 3A:
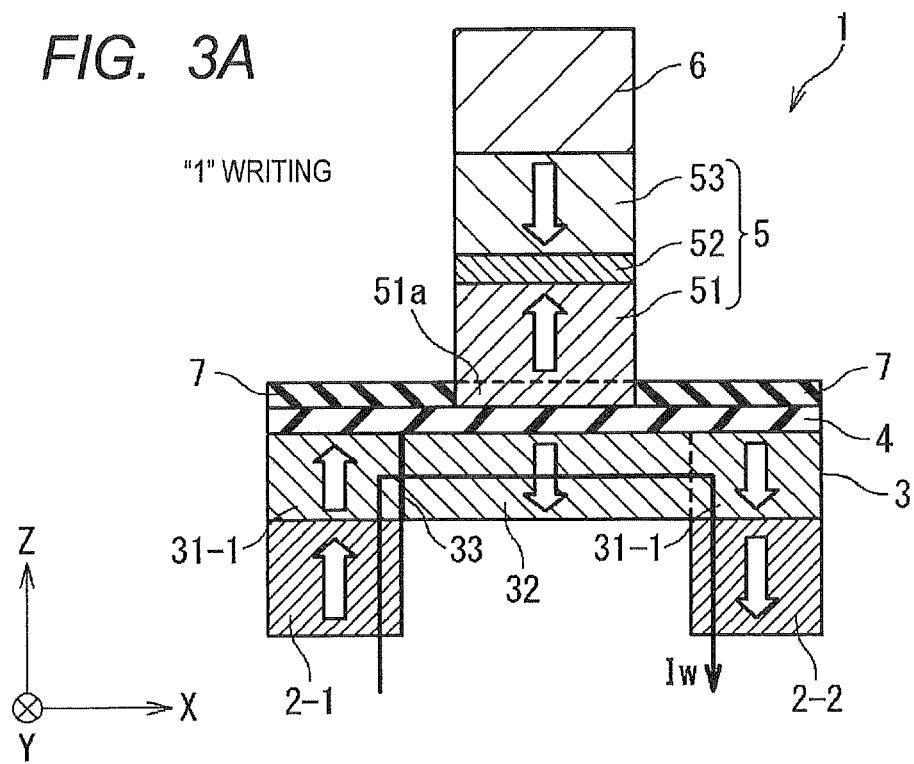
FIG. 3A is a cross-sectional view illustrating an operation of writing data "1" in the magnetic memory cell of FIG. 2.

In the configuration of FIG. 2, data is written to the magnetic memory cell 1 by passing the writing current of the reversed magnetization area 32 between the fixed magnetization areas 31-1 and 31-2. For example, in the case where the reversed magnetization area 32 magnetized in the –Z direction (downward) is associated with data "1" and the reversed magnetization area 32 magnetized in +Z direction (upward) is associated with data "0", as shown in FIG. 3A, data "1" is written by passing a writing current $I_W$ to the fixed magnetization area 31-2 from the fixed magnetization area 31-1 through the reversed magnetization area 32. Thus, spin-polarized electrons are injected from the fixed magnetization area 31-2 to the reversed magnetization area 32 so as to move a domain wall 33 to the boundary between the fixed magnetization area 31-1 and the reversed magnetization area 32.

Figure 3B:
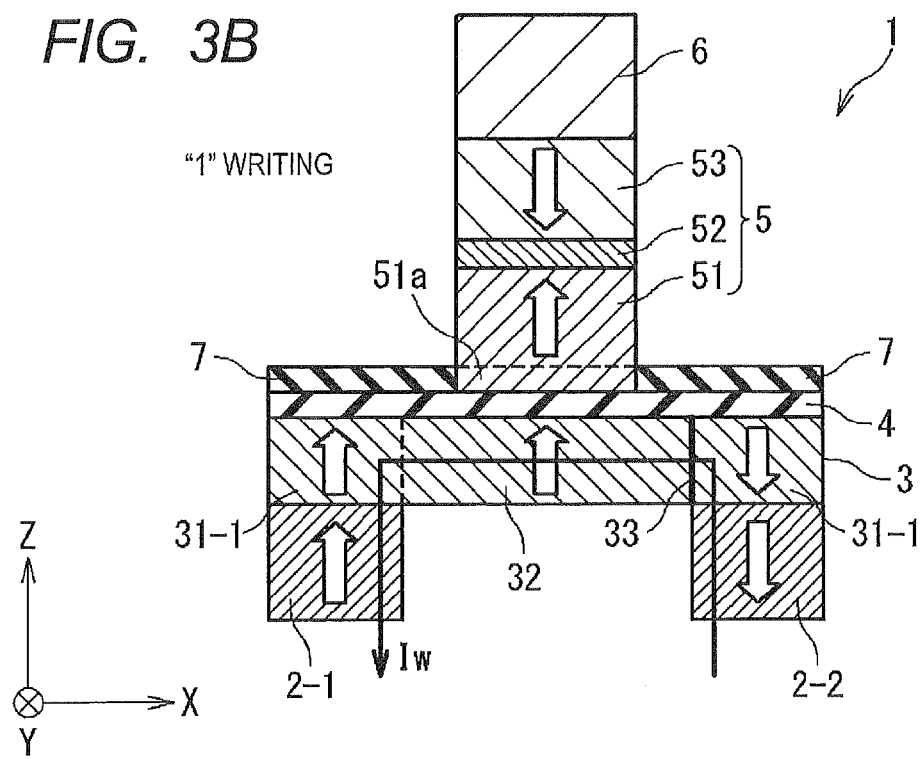
FIG. 3B is a cross-sectional view illustrating an operation of writing data "0" in the magnetic memory cell of FIG. 2.

This leads to orientation of the magnetization of the reversed magnetization area 32 in the same direction as the fixed magnetization area 31-2, that is, in the −Z direction, enabling writing of data "1". As illustrated in FIG. 3B, data "0" is written by passing the writing current $I_W$ to the fixed magnetization area 31-2 from the fixed magnetization area 31-1 through the reversed magnetization area 32. Thus, spin-polarized electrons are injected from the fixed magnetization area 31-2 to the reversed magnetization area 32 so as to move the domain wall 33 to the boundary between the fixed magnetization area 31-2 and the reversed magnetization area 32. Thus, the magnetization of the reversed magnetization area 32 is oriented in the same direction as the fixed magnetization area 31-1, that is, in the +Z direction, enabling writing of data "0". For example, the writing current $I_W$ can be caused to flow by applying a voltage between the fixed magnetization layers 2-1 and 2-2.

Figure 4:
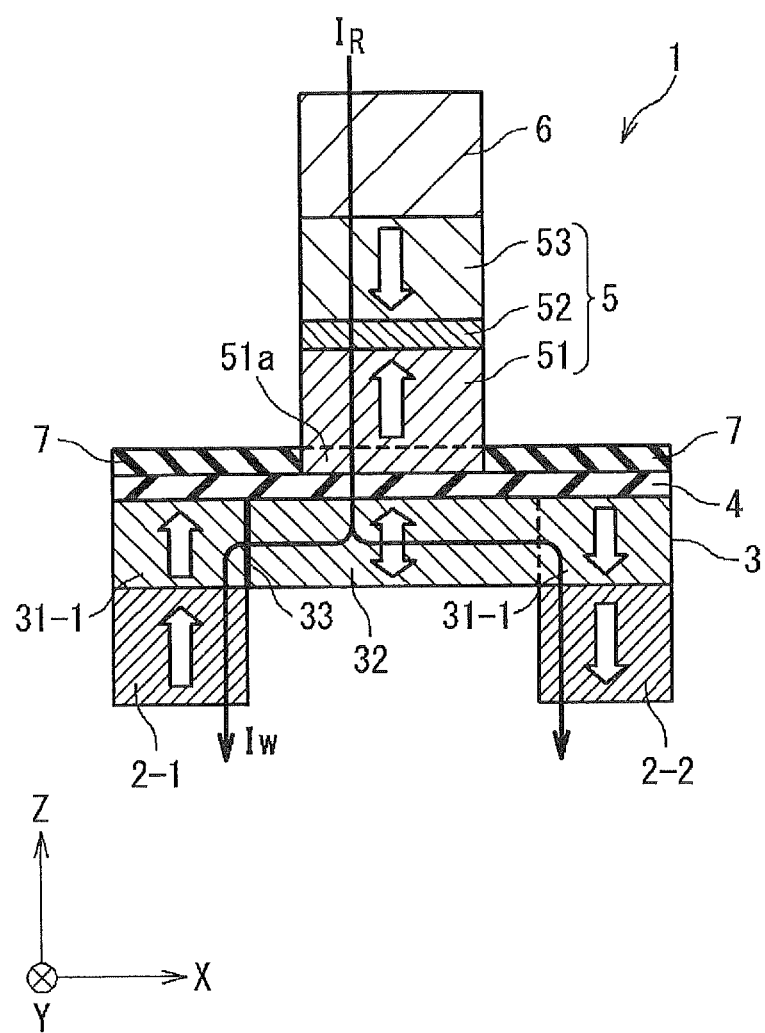
FIG. 4 is a cross-sectional view illustrating a reading operation of the magnetic memory cell illustrated in FIG. 2.

As illustrated in FIG. 4, data is read from the magnetic memory cell 1 by passing a reading current $I_R$ to the magnetic tunnel junction including the reversed magnetization area 32, the tunnel barrier layer 4, and the first ferromagnetic layer 51. The resistance value of the magnetic tunnel junction varies depending upon the relative directions of the reversed magnetization area 32 and the magnetization of the first ferromagnetic layer 51, that is, data written in the magnetic memory cell 1. Hence, the data written in the magnetic memory cell 1 can be identified by detecting fluctuations in the resistance value of the magnetic tunnel junction. For example, data written in the magnetic memory cell 1 may be identified by grinding the fixed magnetization layers 2-1 and 2-2, applying a predetermined voltage to the cap layer 6, and detecting the amount of a reading current $I_R$ applied at this point. Alternatively, the data written in the magnetic memory cell 1 may be identified by passing the constant reading current $I_R$ through a wire (reading wire) coupled to the cap layer 6, and detecting the potential of the wire.

The structures and the forming method of the data storage layer 3, the tunnel barrier layer 4, the reference layer 5, the cap layer 6, and the metallic oxide layer 7 will be specifically described below.

Figure 5:
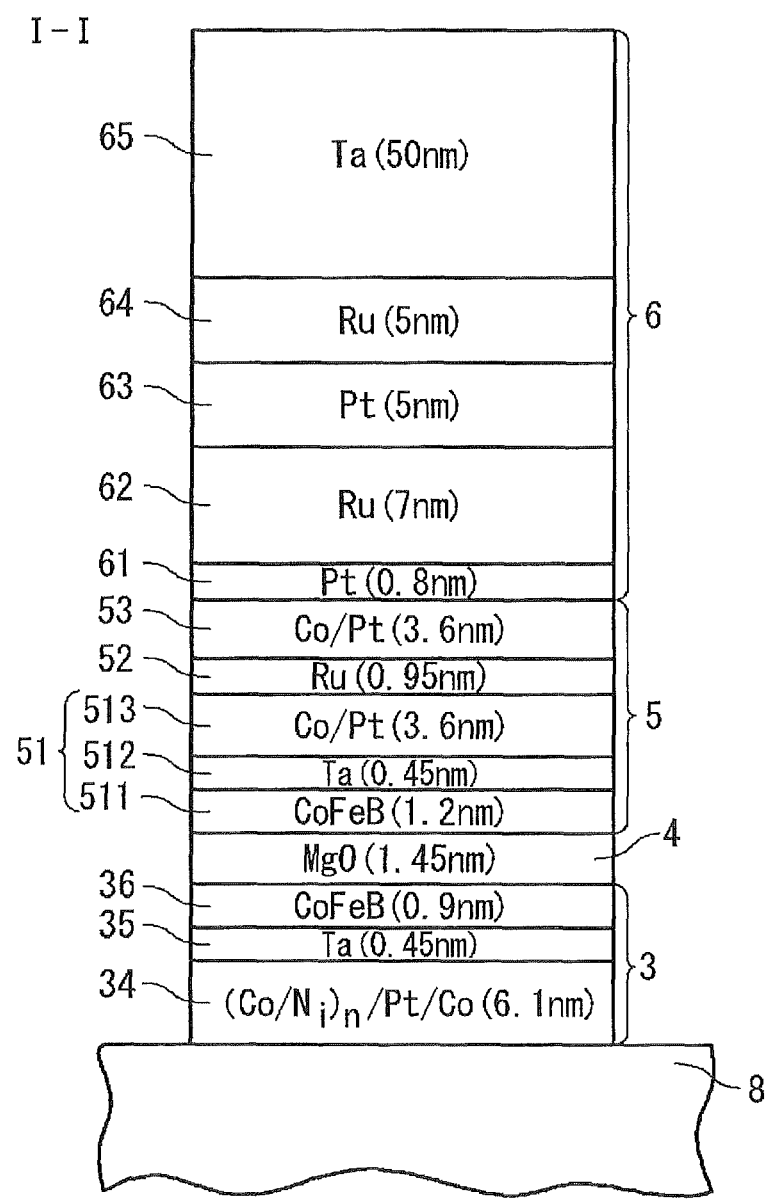
FIG. 5 is a cross-sectional view illustrating an example of the structure of the magnetic memory cell taken along line I-I of FIG. 2.

FIG. 5 is a cross-sectional view illustrating the structure of the magnetic memory cell 1 taken along line I-I of FIG. 2. In the present embodiment, the tunnel barrier layer 4 is a crystalline MgO layer with bcc(001) orientation. The MgO layer has a thickness of, for example, 1.45 nm. In the following explanation, the tunnel barrier layer 4 may be called the MgO layer 4 when the material of the tunnel barrier layer 4 is focused.

The data storage layer 3 is, for example, a laminated body including a perpendicularly magnetized film 34, an extremely thin Ta film 35 formed on the top surface of the perpendicularly magnetized film 34, and a CoFeB film 36 formed on the top surface of the Ta film 35. The perpendicularly magnetized film 34 may be, for example, a laminated body including a Co/Ni laminated film, a Pt film formed on the top surface of the Co/Ni laminated film, and a Co film formed on the top surface of the Pt film. In this case, the Co/Ni laminated film is a laminated body of thin Co films and thin Ni films. The perpendicularly magnetized film 34 configured thus is allowed to have strong anisotropy by fcc(111) orientation.

The data storage layer 3 configured thus effectively improves the MR ratio of the magnetic tunnel junction with satisfactory perpendicular magnetic anisotropy. For example, as disclosed in Djayaprawira et al., "230% room-temperature magnetoresistance in CoFeB/MgO/CoFeB magnetic tunnel junctions", Applied Physics Letters, 86, 092502, 2005, in the case where the tunnel barrier layer 4 is a MgO layer, the CoFeB film 36 is used at least as a contact part between the data storage layer 3 and the tunnel barrier layer 4, thereby improving the MR ratio of the magnetic tunnel junction. In this case, originally, the CoFeB film is a material that is likely to have in-plane magnetic anisotropy. In the case where the perpendicularly magnetized film 34 is a combined film with strong perpendicular magnetic anisotropy (e.g., the laminated body including the Co/Ni laminated film, the Pt film formed thereon, and the Co film formed thereon), the CoFeB film 36 can also exhibit perpendicular magnetic anisotropy.

In this configuration, the extremely thin Ta film 35 inserted between the perpendicularly magnetized film 34 and the CoFeB film 36 acts as an intermediate layer in an amorphous phase. In the case where the CoFeB film 36 is formed over the perpendicularly magnetized film 34 with fcc(111) orientation, the Ta film 35 prevents the crystalline orientation of the perpendicularly magnetized film 34 from affecting the CoFeB film 36. In the case where the tunnel barrier layer 4 is a MgO layer with bcc(001) orientation, the CoFeB film 36 is formed with bcc(100) orientation, thereby improving the MR ratio. The Ta film 35 prevents the fcc(111) orientation of the perpendicularly magnetized film 34 from affecting the CoFeB film 36, facilitating the formation of the CoFeB film 36 with bcc(100) orientation.

In the present embodiment, the Co/Ni laminated film of the perpendicularly magnetized film 34 may include five 0.3-nm Co films and four 0.6-nm Ni films which are stacked in an alternating manner (In this case, the top and bottom layers are Co films). For example, the Pt film and the Co film formed on the Co/Ni laminated film are respectively 1.4 nm and 0.8 nm in thickness. In this case, the perpendicularly magnetized film 34 has a total thickness of 6.1 nm. The Ta film 35 is, for example, 0.45 nm in thickness while the CoFeB film 36 is 0.9 nm in thickness. The Ta film 35 does not always need to be a continuous film and may have an island structure partially covering the perpendicularly magnetized film 34.

The data storage layer 3 may be a laminated body including the Ta film 35 and the CoFeB film 36, instead of the laminated body including the perpendicularly magnetized film 34, the Ta film 35, and the CoFeB film 36. Only the $(Co/Ni)_n/Pt/Co$ laminated film 34 may be used. A thin underlying layer for improving the quality of the films of the data storage layer 3 may be inserted between the fixed magnetization layers 2-1 and 2-2 and the data storage layer 3.

As described above, the reference layer 5 includes the first ferromagnetic layer 51, the non-magnetic layer 52, and the second ferromagnetic layer 53. In the present embodiment, the non-magnetic layer 52 is a Ru film while the second ferromagnetic layer 53 is a Co/Pt laminated film. The Co/Pt laminated film is a laminated body of thin Co films and thin Pt films with perpendicular magnetic anisotropy.

The first ferromagnetic layer 51 is a laminated body including a CoFeB film 511, an extremely thin Ta film 512, and a Co/Pt laminated film 513. Since the laminated body including the CoFeB film 511, the Ta film 512, and the Co/Pt laminated film 513 is used as the first ferromagnetic layer 51, strong perpendicular magnetic anisotropy occurs in the first ferromagnetic layer 51 with a higher MR ratio. Specifically, the CoFeB film 511 formed with bcc(100) orientation on the MgO layer 4 with bcc(001) orientation is suitable for obtaining a large MR ratio as disclosed in, for example, Djayaprawira et al., "230% room-temperature magnetoresistance in CoFeB/MgO/CoFeB magnetic tunnel junctions", Applied Physics Letters, 86, 092502, 2005.

The CoFeB film 511 is made of a material that is likely to have in-plane magnetic anisotropy, which may cause a problem in the magnetic memory cell 1 including a ferromagnetic layer having perpendicular magnetic anisotropy. In order to solve the problem, the Co/Pt laminated film 513 is used that has perpendicular magnetic anisotropy with fcc(111) orientation. The Co/Pt laminated film 513 having perpendicular magnetic anisotropy is magnetically coupled to the CoFeB film 511, allowing the CoFeB film 511 to have perpendicular magnetic anisotropy.

In the case where the Co/Pt laminated film 513 with fcc (111) orientation is in direct contact with the CoFeB film 511, the crystalline structure of the Co/Pt laminated film 513 affects the CoFeB film 511 in high-temperature heat treatment after the deposition of the reference layer 5 in the manufacturing process, which may prevent the CoFeB film 511 from changing to a proper bcc structure. Thus, it is difficult to provide the MgO layer with a bcc structure in contact with the CoFeB film 511. Consequently, an originally expected high MR ratio cannot be obtained.

The extremely thin Ta film 512 interrupts the continuity of a crystalline structure between the CoFeB film 511 with bcc (100) orientation and the Co/Pt laminated film 513 with fcc (111) orientation. The extremely thin Ta film 512 grown as an intermediate layer having an amorphous phase prevents fcc crystalline orientation from propagating from the Co/Pt laminated film 513 to the CoFeB film 511 in high-temperature heat treatment. This allows the MgO layer 4 and the CoFeB film 511 to have satisfactory bcc structures with an effectively improved MR ratio.

In the present embodiment, the CoFeB film 511, the Ta film 512, and the Co/Pt laminated film 513 of the first ferromagnetic layer 51 are respectively 1.2 nm, 0.45 nm, and 3.6 nm in thickness. The Ta film 512 does not always need to be a continuous film. The Ta film 512 may have an island structure partially covering the CoFeB film 511. The Co/Pt laminated film 513 having a thickness of 3.6 nm can be formed by, for example, alternately stacking five 0.4-nm Co films and four 0.4-nm Pt films. In this case, the Co films are respectively located at the top and bottom of the Co/Pt laminated film 513.

The cap layer 6 is a laminated body including a Pt film 61, a Ru film 62, a Pt film 63, a Ru film 64, and a Ta film 65. In the present embodiment, the respective thicknesses of the Pt film 61, the Ru film 62, the Pt film 63, the Ru film 64, and the Ta film 65 are 0.8 nm, 7 nm, 5 nm, 5 nm, and 50 nm.

Figure 6:
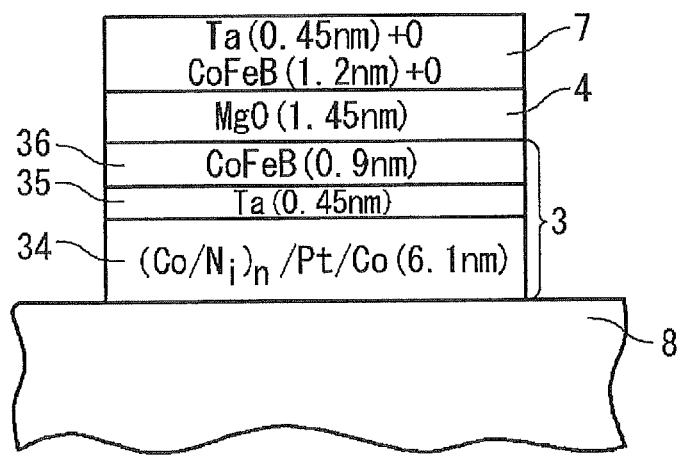
FIG. 6 is a cross-sectional view illustrating the structure of the magnetic memory cell taken along line II-II of FIG. 2.

FIG. 6 is a cross-sectional view illustrating the structure of the magnetic memory cell 1 taken along line II-II of FIG. 2. In the II-II section where the tunnel barrier layer 4 is not covered with the reference layer 5, the metallic oxide layer 7 is formed on the tunnel barrier layer 4 (MgO layer). The metallic oxide layer 7 contains an oxide of a material of a part of the reference layer 5. In the present embodiment, the reference layer 5 includes the CoFeB film 511 and the Ta film 512 while the metallic oxide layer 7 contains an oxide of CoFeB and an oxide of Ta.

Figure 7A:
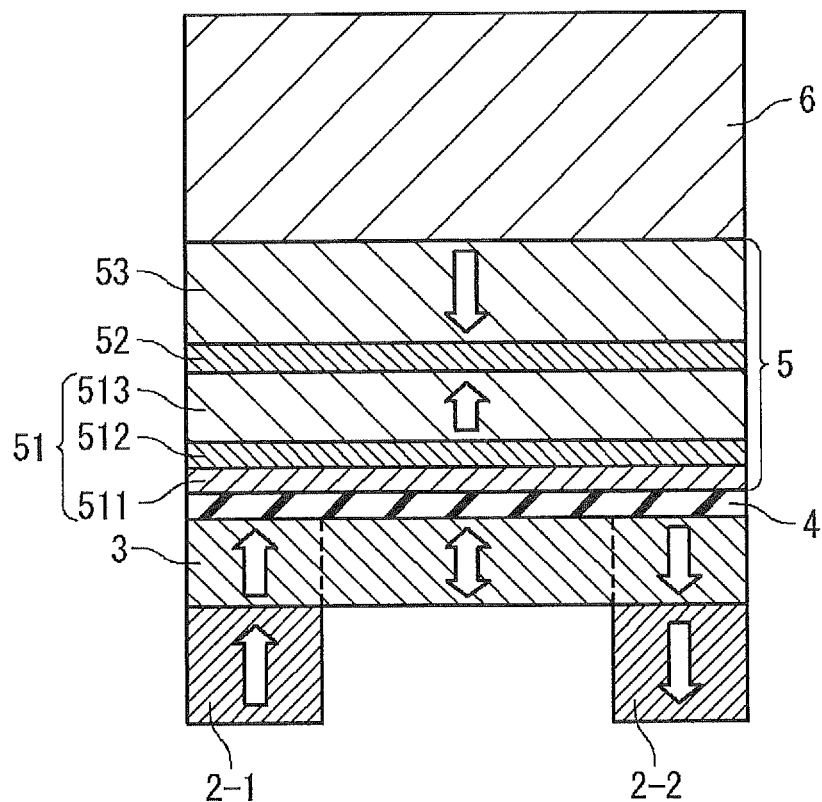
FIG. 7A is a cross-sectional view for explaining a process of forming a cap layer, a reference layer, and a metallic oxide layer in the magnetic memory cell of FIG. 2.
Figure 7B:
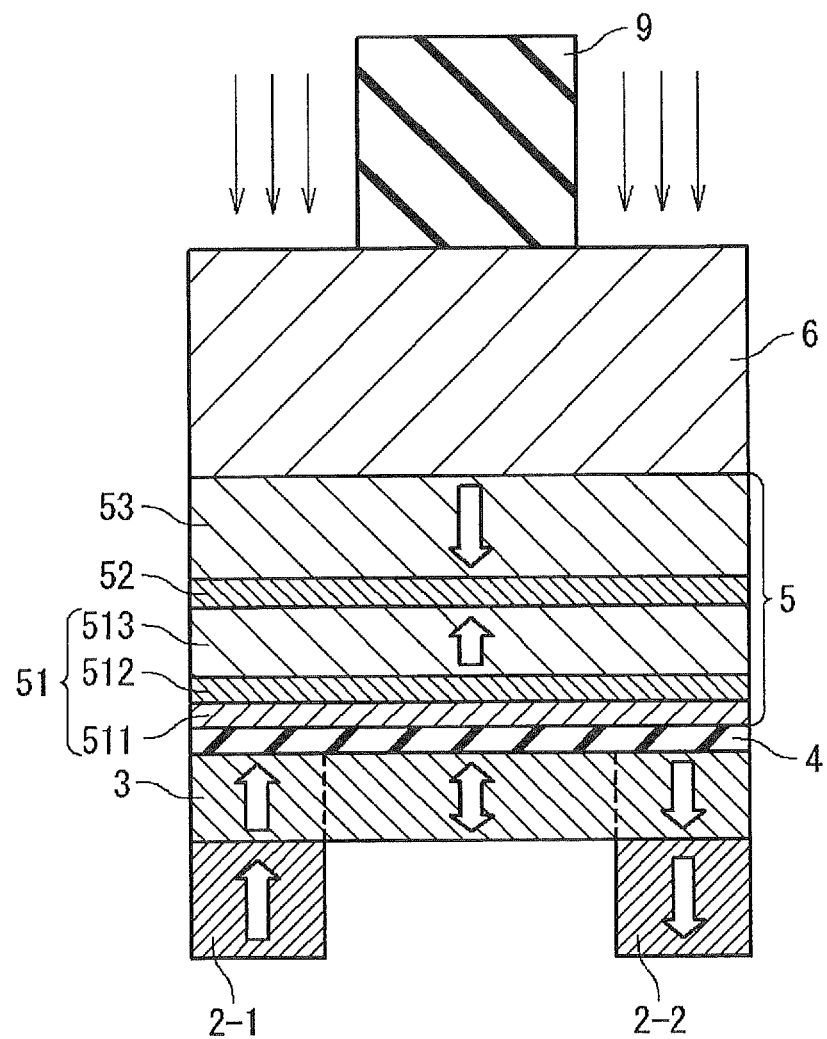
FIG. 7B is a cross-sectional view for explaining the process of forming the cap layer, the reference layer, and the metallic oxide layer in the magnetic memory cell of FIG. 2.
Figure 7C:
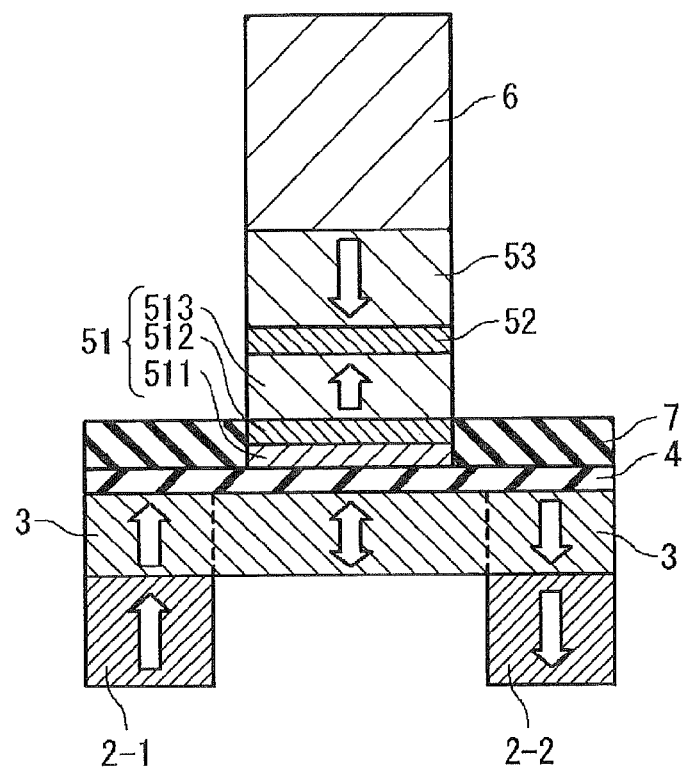
FIG. 7C is a cross-sectional view for explaining the process of forming the cap layer, the reference layer, and the metallic oxide layer in the magnetic memory cell of FIG. 2.

FIGS. 7A to 7C are cross-sectional views illustrating the process of forming the magnetic memory cell 1, more specifically, the process of forming the reference layer 5, the cap layer 6 (see FIG. 5), and the metallic oxide layer 7 (see FIG. 6). First, as illustrated in FIG. 7A, the fixed magnetization layers 2-1 and 2-2 are formed, the data storage layer 3, the tunnel barrier layer 4, the reference layer 5, and the cap layer 6 are deposited, and then the cap layer 6 is patterned.

As illustrated in FIG. 7B, a hard mask 9 is then formed on the cap layer 6. The hard mask 9 is, for example, a laminated body of a silicon oxide film and a silicon nitride film. As illustrated in FIG. 7C, a part uncovered with the hard mask 9 on the cap layer 6 and the reference layer 5 is etched.

Specifically, first, the Ta film 65 located at the top of the cap layer 6 is etched by using chlorine gas as etching gas. The Ta film 65 is etched during detection of an endpoint. After the detection of the etching endpoint, a certain amount of overetching is performed. The cap layer 6 is purged with Ar gas, and then is reduced in an atmosphere of reduced gas containing He gas as a principle component and a small amount of $H_2$ gas.

Furthermore, the remaining part of the cap layer 6 and the reference layer 5 are etched by using alcohol gas, i.e., methanol ($CH_3OH$) as etching gas.

However, the reference layer 5 is not fully etched in the thickness direction. The etching is stopped at a desired position during detection of an endpoint. For example, the remaining part (that is, the Pt film 61, the Ru film 62, the Pt film 63, and the Ru film 64) of the cap layer 6 and the second ferromagnetic layer 53 (Co/Pt laminated film), the non-magnetic layer 52 (Ru film), and the Co/Pt laminated film 513 of the reference layer 5 are etched; meanwhile, the Ta film 512 and the CoFeB film 511 are left unetched.

In this case, the alcohol etching gas is oxidative. Thus, in the etching process, a part uncovered with the hard mask 9 is oxidized on the remaining part of the reference layer 5, forming the metallic oxide layer 7 as an insulator. For example, in the case where the Ta film 512 and the CoFeB film 511 are left unetched, a part uncovered with the hard mask 9 is oxidized on the Ta film 512 and the CoFeB film 511, forming the metallic oxide layer 7 containing a Ta oxide and a CoFeB oxide. The metallic oxide layer 7 having insulating properties electrically isolates the reference layer 5 and the data storage layer 3. The magnetic memory cell 1 in FIG. 2 can be formed by this process.

The cap layer 6 and the reference layer 5 may be etched by nonoxidative etching gas. In this case, the remaining part of the reference layer 5 is not oxidized by etching and thus is additionally annealed in an oxidized atmosphere so as to oxidize the part uncovered with the hard mask 9, thereby forming the metallic oxide layer 7. However, the use of oxidative alcohol etching gas according to the present embodiment eliminates the need for additional annealing in an oxidized atmosphere to form the metallic oxide layer 7, preferably simplifying the process.

Figure 8:
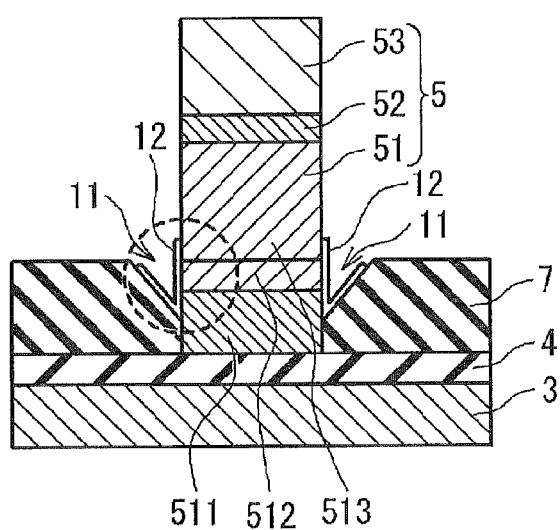
FIG. 8 is a cross-sectional view illustrating a mechanism for preventing short circuits in the structure of the magnetic memory cell illustrated in FIG. 2.

The structure and forming process of the magnetic memory cell 1 according to the present embodiment can advantageously suppress short circuits in the magnetic memory cell 1. In the present embodiment, etching is stopped in a state in which the metallic oxide layer 7 is provided on the tunnel barrier layer 4. Thus, as illustrated in FIG. 8, even if the trench 11 is formed near the end of the reference layer 5, the possibility of penetration of the trench 11 through the tunnel barrier layer 4 can be reduced. This can reduce the occurrence of short circuits between the reference layer 5 and the data storage layer 3 in the event of a re-deposited material 12 on the inner surface of the trench 11 in the etching process.

The inventors have conducted an experiment to demonstrate the effect of suppressing short circuits by the forming process of the magnetic memory cell 1 according to the present embodiment. Specifically, six wafers are produced by etching with an endpoint set at a point in the reference layer 5 (Example, specifically, on the top surface of the Ta film 512); meanwhile, six wafers are produced by etching with an endpoint set at the top surface of the MgO layer 4 (Comparative example). Each of the wafers includes a predetermined number of magnetic memory cells 1. Other manufacturing conditions are identical. The ratio of short-circuited magnetic memory cells 1 is measured by an electric measurement for each of the wafers.

FIG. 9 is a table showing the effect of suppressing short circuits in the forming process of the magnetic memory cell 1 according to the present embodiment. As is understood from FIG. 9, in the case of etching with an endpoint set at the top surface of the MgO layer 4 according to the comparative example, the ratio of short-circuited magnetic memory cells 1 is at least 95.2%, whereas in the case of etching with an endpoint set at a point in the reference layer 5 according to the example, the ratio of short-circuited magnetic memory cells 1 can be suppressed to 1.3% to 3.5%.

Additionally, the structure and the forming process of the magnetic memory cell 1 according to the present embodiment can advantageously suppress etching damage on the data storage layer 3 and improve magnetic characteristics of the magnetic memory cell 1. In the structure and forming process of the magnetic memory cell 1 according to the present embodiment, the data storage layer 3 can be kept covered with the tunnel barrier layer 4 and the metallic oxide layer 7 during the etching process. In other words, the layers covering the data storage layer 3 can be increased in thickness, thereby reducing damage to the data storage layer 3.

During etching on the reference layer 5 and the cap layer 6, an etching stop position affects the magnetic characteristics of the magnetic memory cell 1, particularly the magnetic characteristics of the data storage layer 3. The relationship between an etching stop position and the magnetic characteristics will be discussed below.

Figure 10:
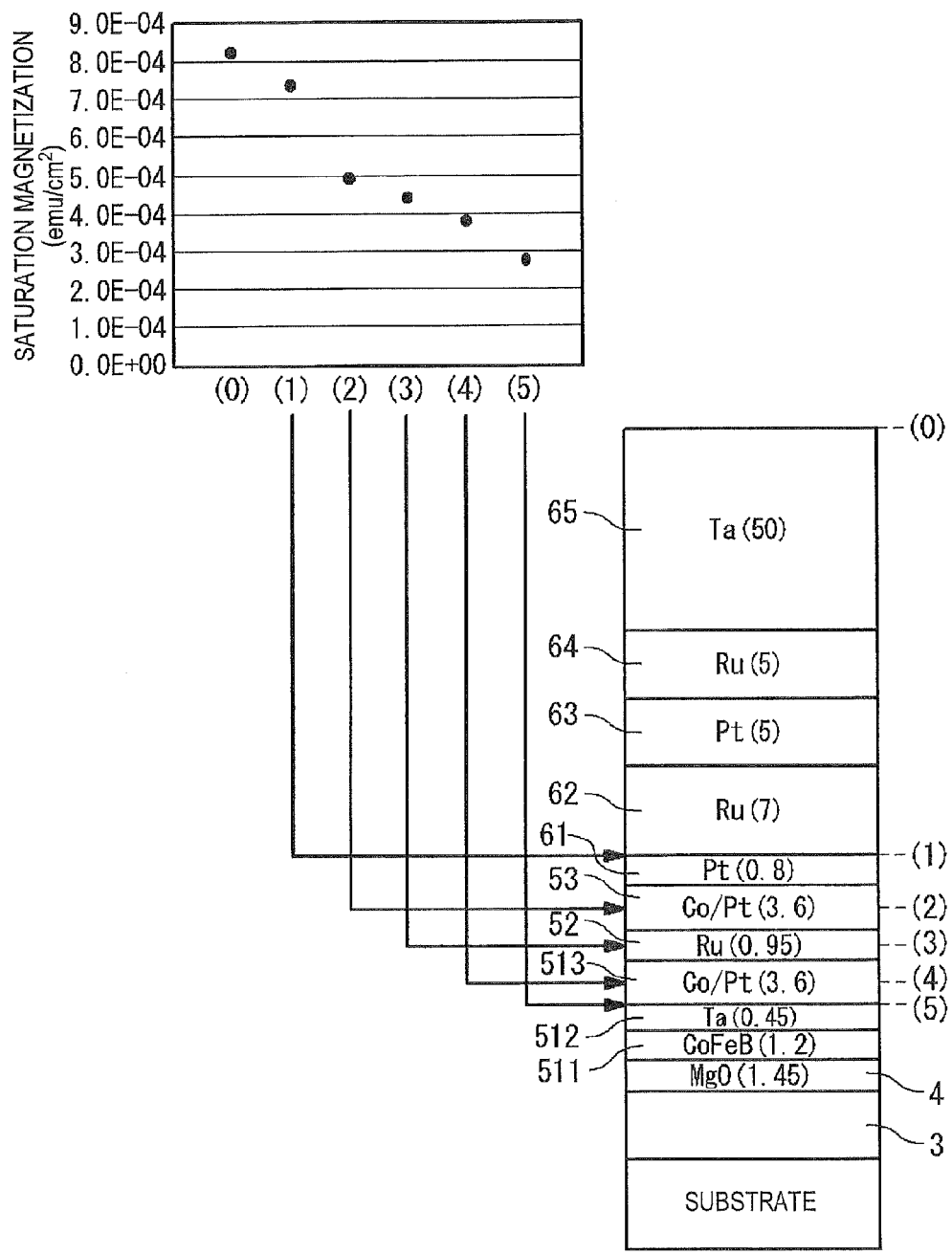
FIG. 10 is a graph showing the relationship between an etching end point of the reference layer and saturation magnetization.

FIG. 10 is a graph showing the relationship between an etching stop position and the saturation magnetization of the overall magnetic memory cell 1. The graph in FIG. 10 is obtained by the following experiments: After the fixed magnetization layers 2-1 and 2-2 are formed, the data storage layer 3, the tunnel barrier layer 4, the reference layer 5, and the cap layer 6 are deposited, and then the hard mask 9 is formed thereon. The layers are etched with etching endpoints set at the following positions (1) to (5): position (1) at the top surface of the Pt film 61; position (2) at an intermediate position of the second ferromagnetic layer 53 (Co/Pt laminated film) in the thickness direction of the second ferromagnetic layer 53; position (3) at an intermediate position of the non-magnetic layer 52 (Ru film) in the thickness direction of the non-magnetic layer 52; position (4) at an intermediate position of the Co/Pt laminated film 513 in the first ferromagnetic layer 51 in the thickness direction of the Co/Pt laminated film 513; and position (5) at the top surface of the Ta film 512. Position (0) means that the hard mask 9 has been removed without etching after the formation of the hard mask 9.

As is understood from FIG. 10, the saturation magnetization of a sample (the overall magnetic memory cell 1) decreases with the progress of etching. It is expected that the saturation magnetization decreases with removal of the second ferromagnetic layer 53 and the first ferromagnetic layer 51. Considering this point, the results in FIG. 10 show that the reference layer 5 and the cap layer 6 can be substantially etched to desired positions.

Figure 11:
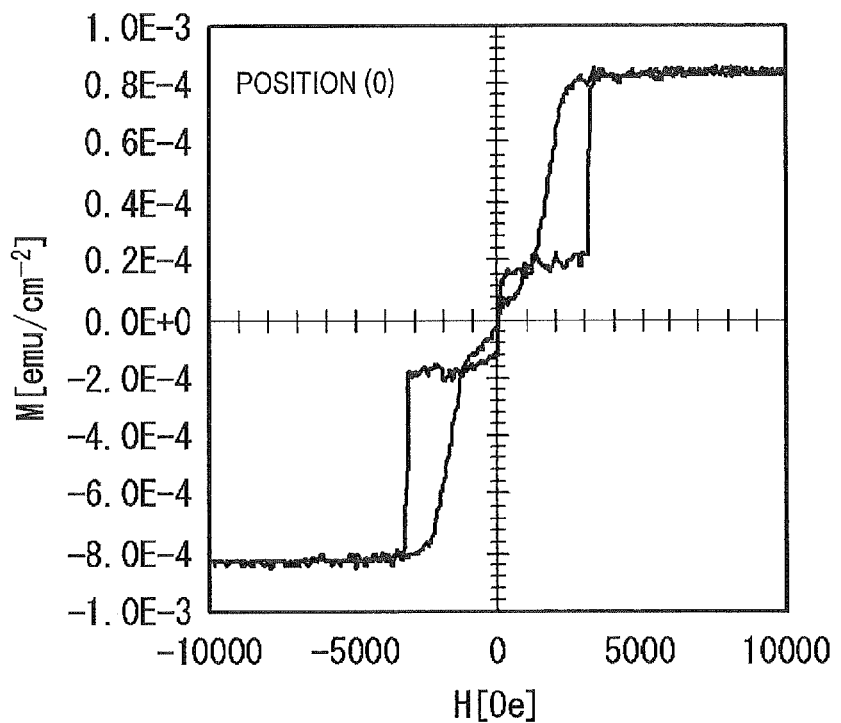
FIG. 11 is a graph showing the MH loop of the magnetic memory cell including the unetched reference layer and cap layer.
Figure 12A:
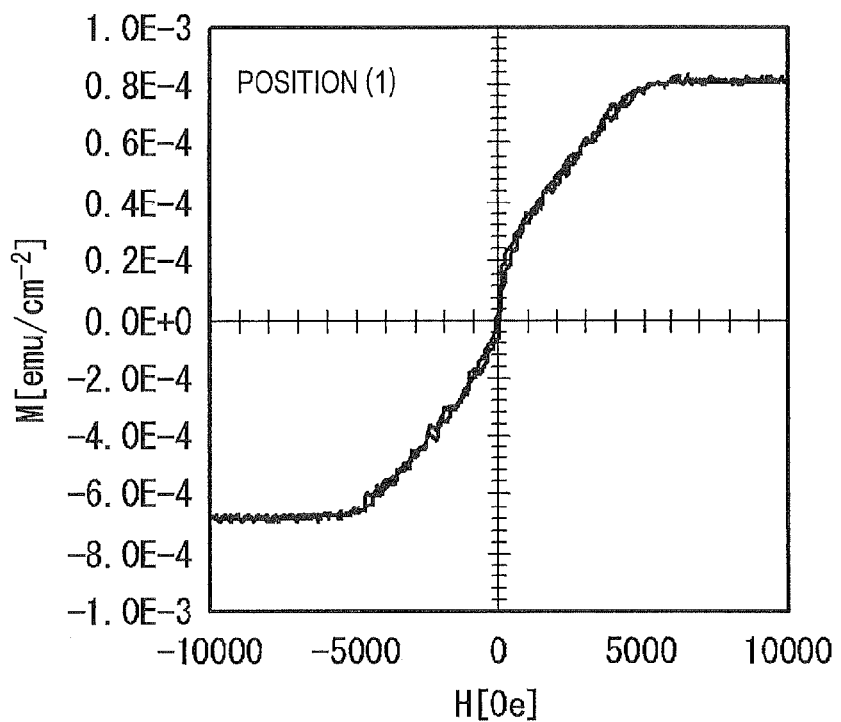
FIG. 12A is a graph showing the MH loop of the magnetic memory cell etched to position (1) in FIG. 10.
Figure 12B:
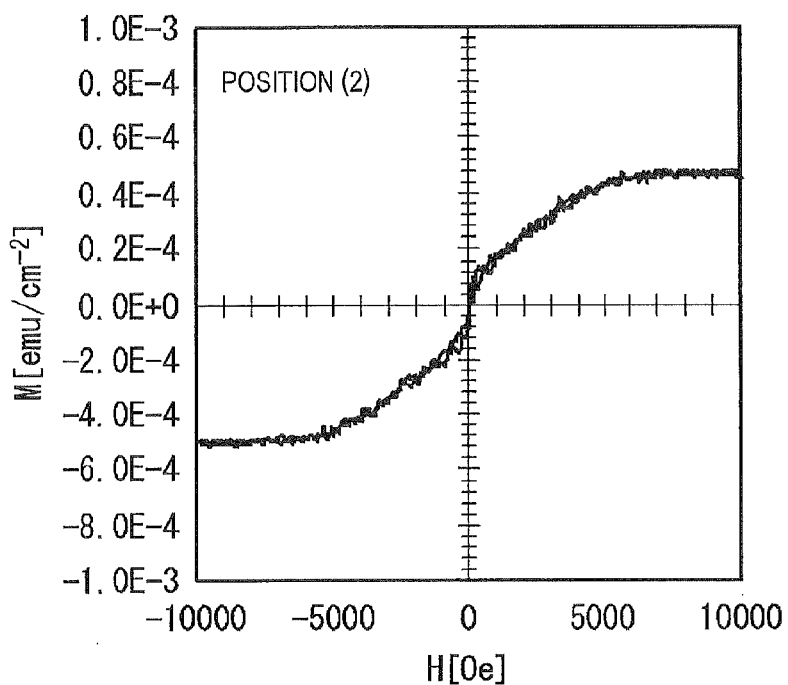
FIG. 12B is a graph showing the MH loop of the magnetic memory cell etched to position (2) in FIG. 10.
Figure 12C:
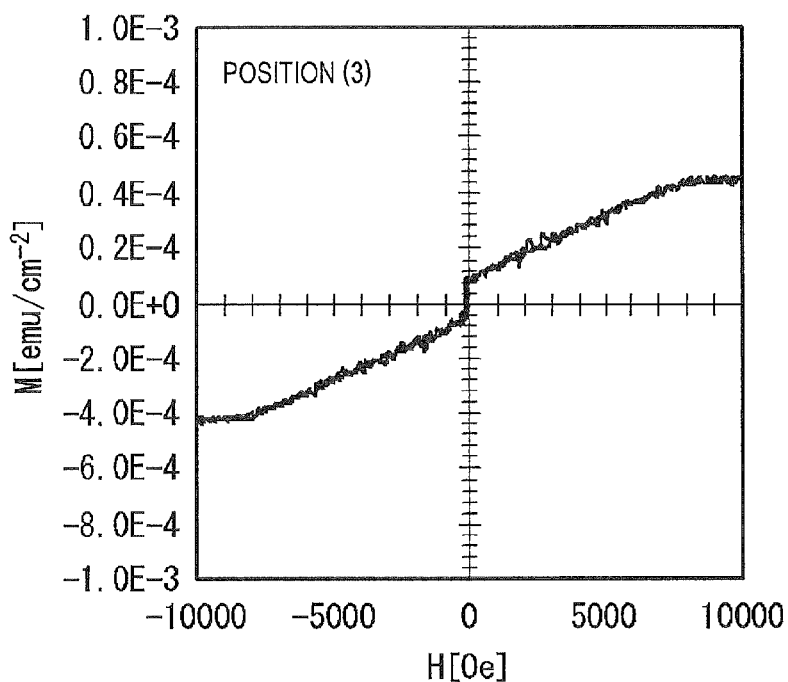
FIG. 12C is a graph showing the MH loop of the magnetic memory cell etched to position (3) in FIG. 10.
Figure 12D:
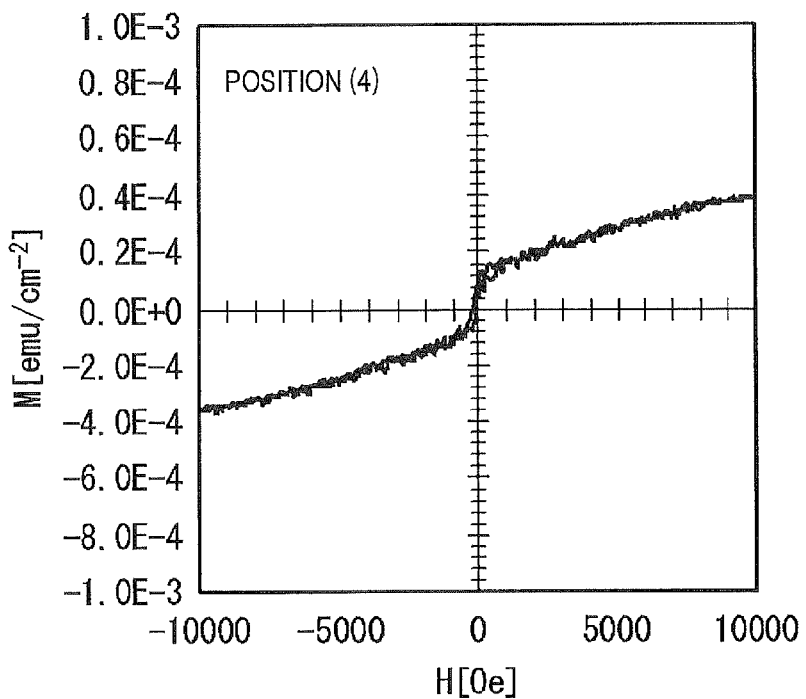
FIG. 12D is a graph showing the MH loop of the magnetic memory cell etched to position (4) in FIG. 10.
Figure 12E:
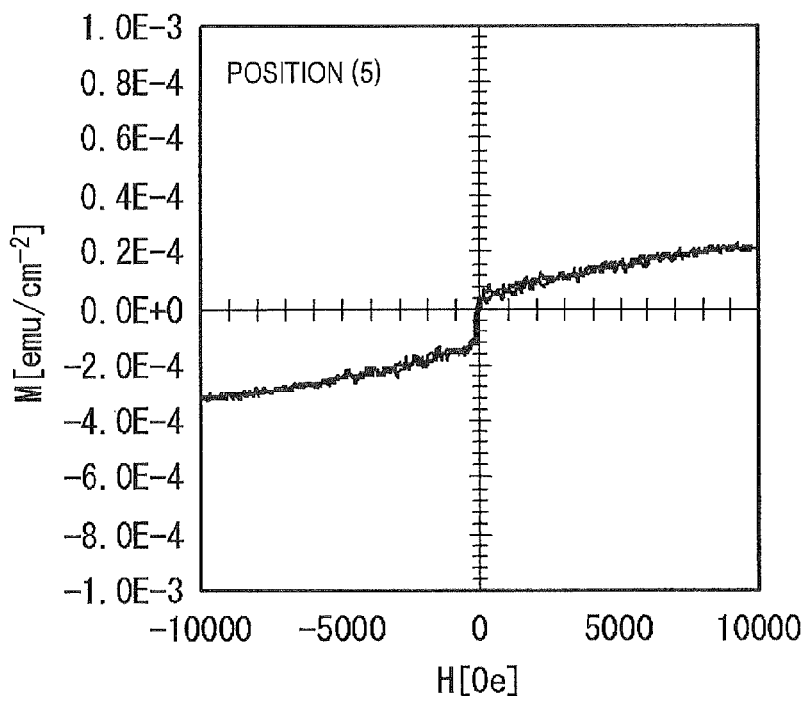
FIG. 12E is a graph showing the MH loop of the magnetic memory cell etched to position (5) in FIG. 10.

FIG. 11 shows the MH loop (magnetization–magnetic field property loop) of an unetched sample (position (0)). FIGS. 12A to 12E show the MH loops of samples etched to the positions (1) to (5). In the measurements of the MH loops, a magnetic field is changed between −10000 Oe and 10000 Oe on each of the samples in the +Z direction. Since the magnetic field is applied in the Z-axis direction (the vertical direction of the sample), the MH loops in FIGS. 11, 12A to 12E show the perpendicular magnetic anisotropies of the samples.

Regarding the unetched sample (the sample at the position (0)), a magnetic field is applied to reverse the magnetization of the Co/Pt laminated film 513 of the first ferromagnetic layer 51 and the second ferromagnetic layer 53 (Co/Pt laminated film), obtaining a so-called butterfly MH loop. The magnetization only slightly increases after the reversal of magnetization, enabling a clear observation of magnetic saturation.

Regarding the samples at the positions (1) to (5), a butterfly MH loop is not observed. However, regarding the samples at the positions (1) to (3), slightly increased magnetization is observed even in an area having a weak magnetic field, leading to imperfect magnetic saturation, whereas regarding the samples at the positions (4) and (5), magnetic saturation is observed.

This result reflects that in the case where etching is stopped at a position where the Co/Pt laminated film (the Co/Pt laminated film 513 of the first ferromagnetic layer 51 and the second ferromagnetic layer 53) is left (that is, at the positions (1) to (3)), the remaining Co/Pt laminated film loses perpendicular magnetic anisotropy and obtains in-plane magnetic anisotropy. The Co/Pt laminated film 513 of the first ferromagnetic layer 51 perfectly remains in the sample etched to the position (1) where the reference layer 5 is unetched, the sample etched to the position (2) where only a part of the second ferromagnetic layer 53 (Co/Pt laminated film) of the reference layer 5 is etched, and the sample etched to the position (3) where only the second ferromagnetic layer 53 of the reference layer 5 is etched. Additionally, in the sample etched to the position (1), the second ferromagnetic layer 53 perfectly remains, whereas in the sample etched to the position (2), the second ferromagnetic layer 53 partially remains. In the samples etched to the positions (1) to (3) where the Co/Pt laminated film remains with in-plane magnetic anisotropy exhibited by etching, the magnetic saturation deteriorates. The Co/Pt laminated film having in-plane magnetic anisotropy hardly remains in the sample etched to the position (5) where the Co/Pt laminated film 513 of the first ferromagnetic layer 51 and the second ferromagnetic layer 53 (Co/Pt laminated film) are completely removed, and the sample etched to the position (4) where the Co/Pt laminated film 513 and the second ferromagnetic layer 53 are mostly removed. Thus, relatively clear magnetic saturation is observed. In the sample etched to the position (4), it is estimated that the Co/Pt laminated film 513 of the first ferromagnetic layer 51 partially remains but is oxidized by the use of oxidative alcohol etching gas, leading to the absence of in-plane magnetic anisotropy.

The Co/Pt laminated film remaining with in-plane magnetic anisotropy in the magnetic memory cell 1 is not preferable because the Co/Pt laminated film deteriorates the perpendicular magnetic anisotropy of the data storage layer 3. The inventors have evaluated the minor loops of the samples to prove the fact. The minor loop is measured while a magnetic field on the sample is changed between −500 Oe and 500 Oe in the +Z direction. The minor loop indicates the magnetization reversal of the data storage layer 3. A square minor loop shows that the data storage layer 3 keeps perpendicular magnetic anisotropy.

Figure 13:
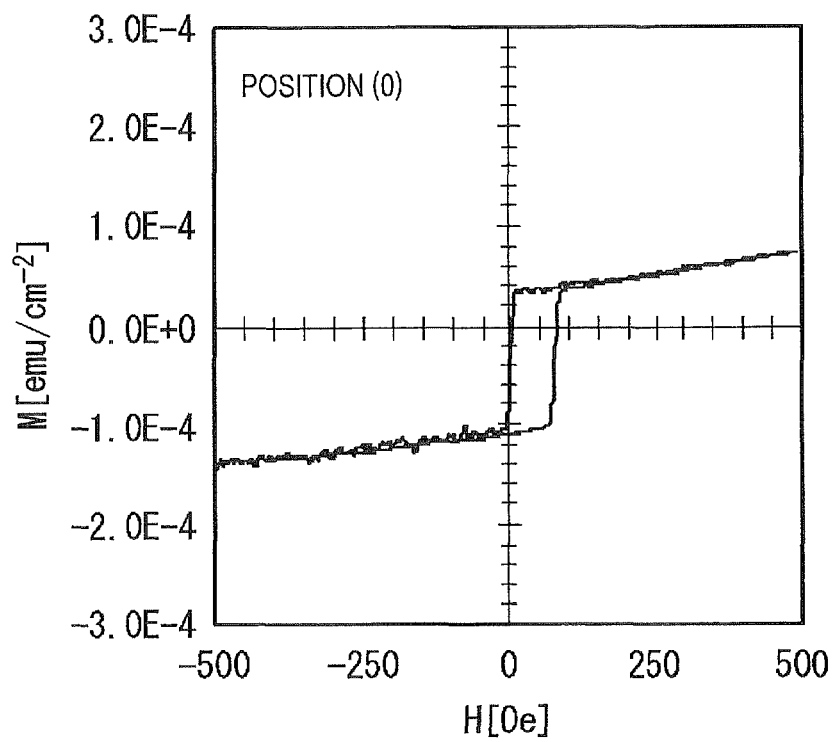
FIG. 13 shows the minor loop of the magnetic memory cell including the unetched reference layer and cap layer.
Figure 14A:
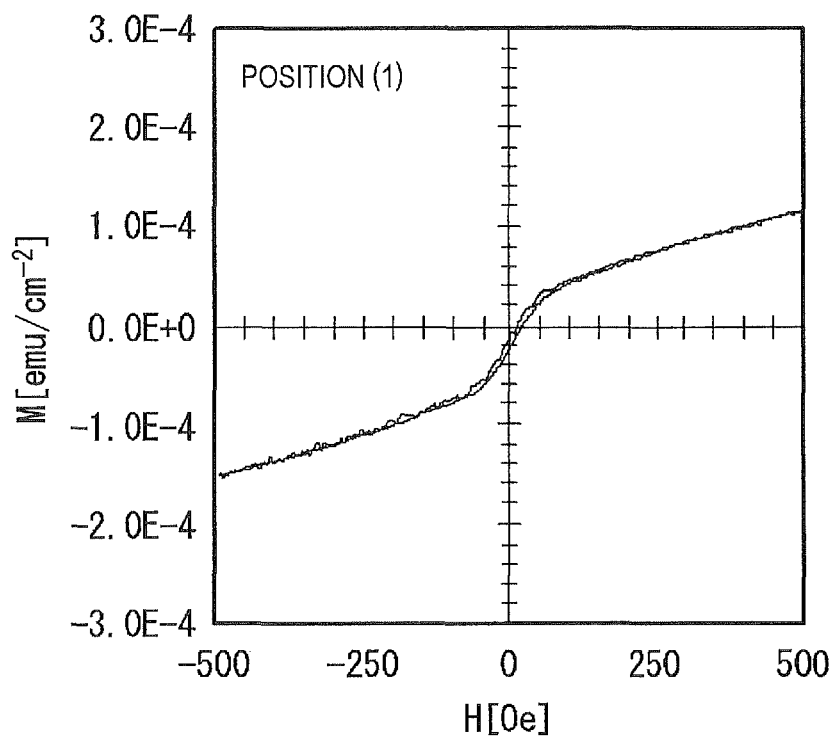
FIG. 14A is a graph showing the minor loop of the magnetic memory cell etched to position (1) in FIG. 10.
Figure 14B:
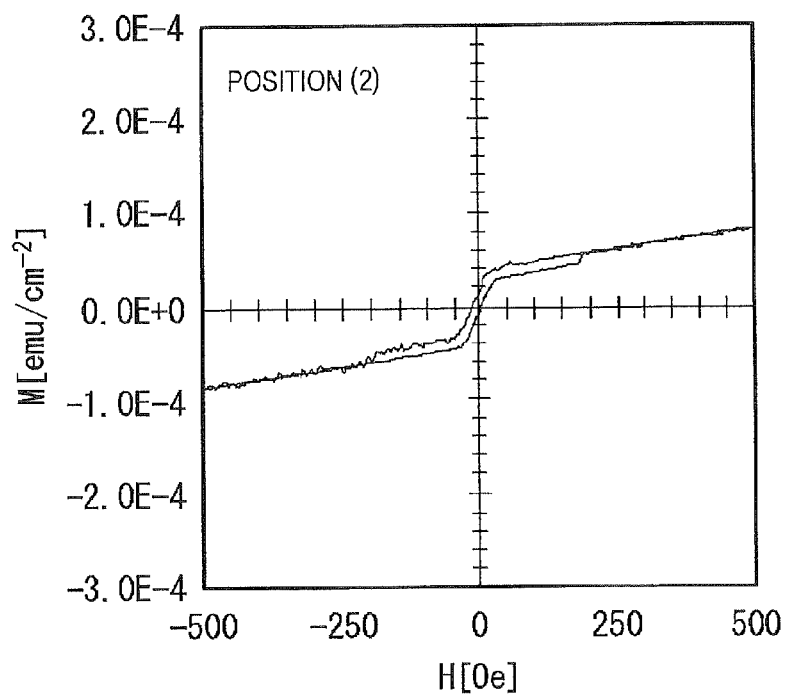
FIG. 14B is a graph showing the minor loop of the magnetic memory cell etched to position (2) in FIG. 10.
Figure 14C:
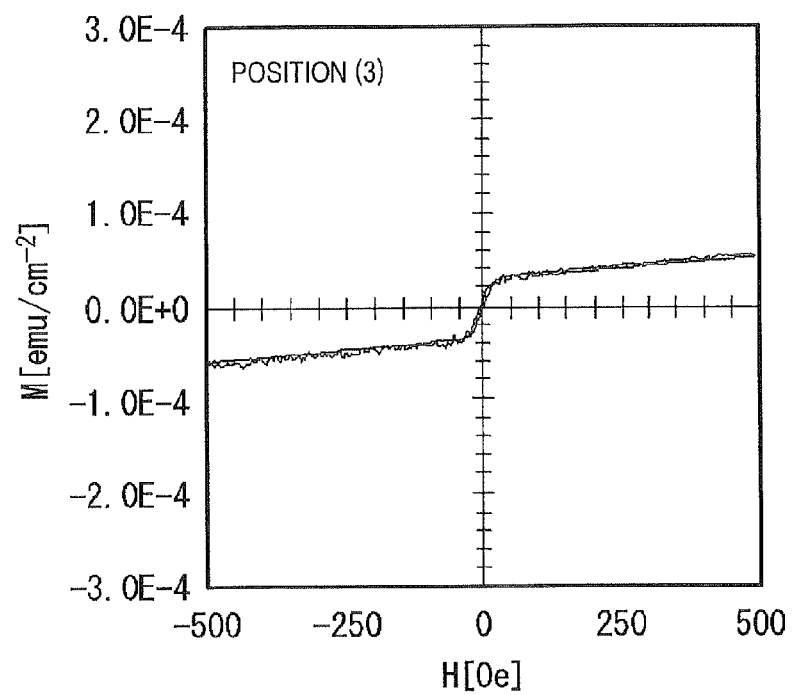
FIG. 14C is a graph showing the minor loop of the magnetic memory cell etched to position (3) in FIG. 10.
Figure 14D:
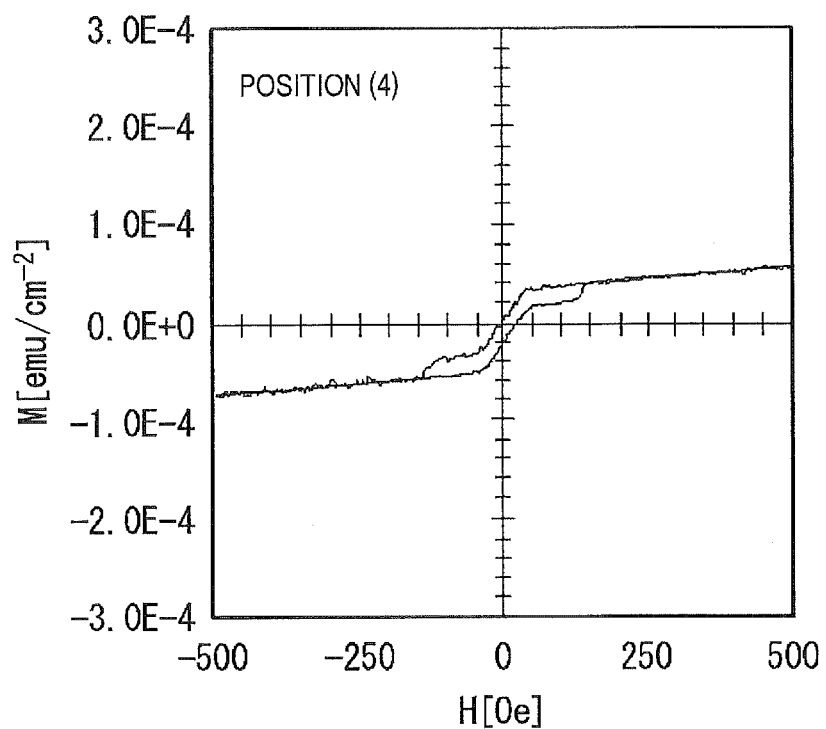
FIG. 14D is a graph showing the minor loop of the magnetic memory cell etched to position (4) in FIG. 10.
Figure 14E:
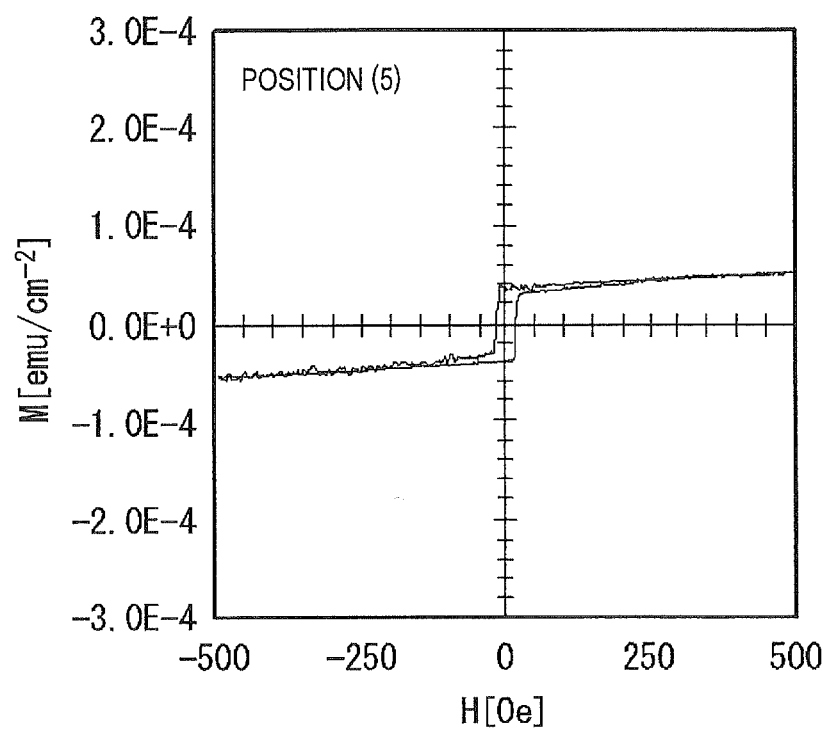
FIG. 14E is a graph showing the minor loop of the magnetic memory cell etched to position (5) in FIG. 10.

FIG. 13 shows the minor loop of the magnetization-magnetic field property of the unetched sample (the sample at the position (0)). FIGS. 14A to 14E show the minor loops of the samples etched to the positions (1) to (5), respectively.

The unetched sample at the position (0) has a square minor loop, which means that the data storage layer 3 has perpendicular magnetic anisotropy. The offset of The magnetization-magnetic field property of the sample at the position (0) is considered to be caused by the influence of a magnetic field generated by the Co/Pt laminated film (the Co/Pt laminated film 513 of the first ferromagnetic layer 51 and the second ferromagnetic layer 53).

Regarding the samples etched to the positions (1) to (3) where the Co/Pt laminated film with in-plane magnetic anisotropy exhibited by etching remains in the magnetic memory cell 1, the minor loops do no exhibit clear hysteresis. This is because the Co/Pt laminated film having in-plane magnetic anisotropy induces in-plane magnetic anisotropy to the data storage layer 3.

Regarding the samples etched to the positions (4) and (5) where the Co/Pt laminated film exhibiting in-plane magnetic anisotropy is substantially removed from the magnetic memory cell 1, hysteresis is observed on the minor loops. This means that perpendicular magnetic anisotropy is obtained in the data storage layer 3. Particularly, the sample etched to the position (5) (the sample where the Co/Pt laminated film 513 of the first ferromagnetic layer 51 and the second ferromagnetic layer 53 are completely removed) obtains a clear and square minor loop. This means that satisfactory perpendicular magnetic anisotropy is obtained in the data storage layer 3 of the sample etched to the position (5).

Figure 15A:
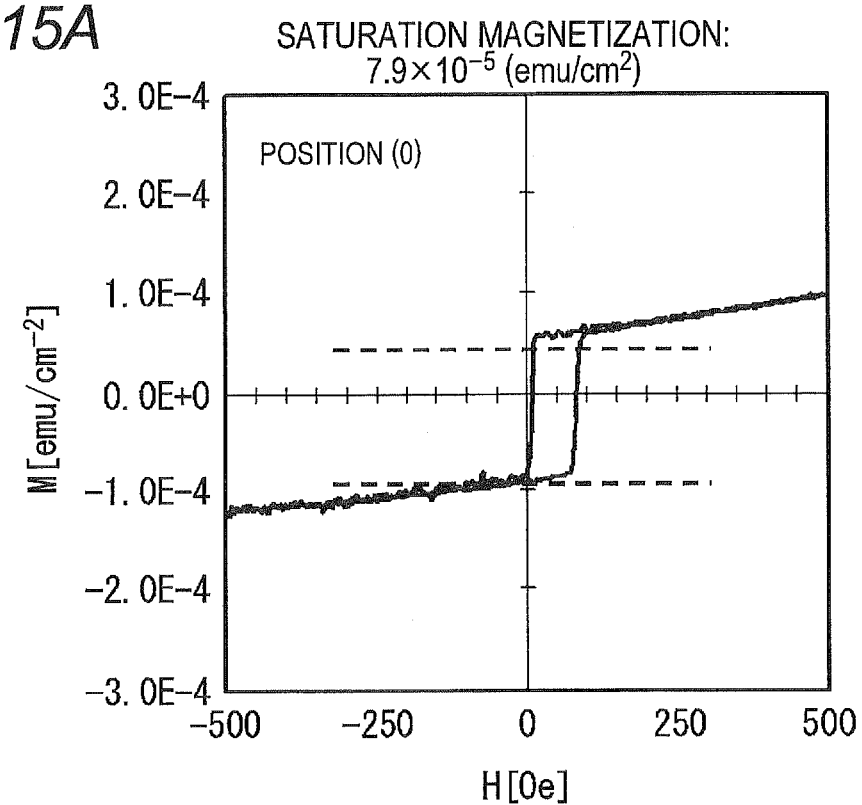
FIG. 15A is an enlarged view showing the minor loop of the magnetic memory cell including the unetched reference layer and cap layer.
Figure 15B:
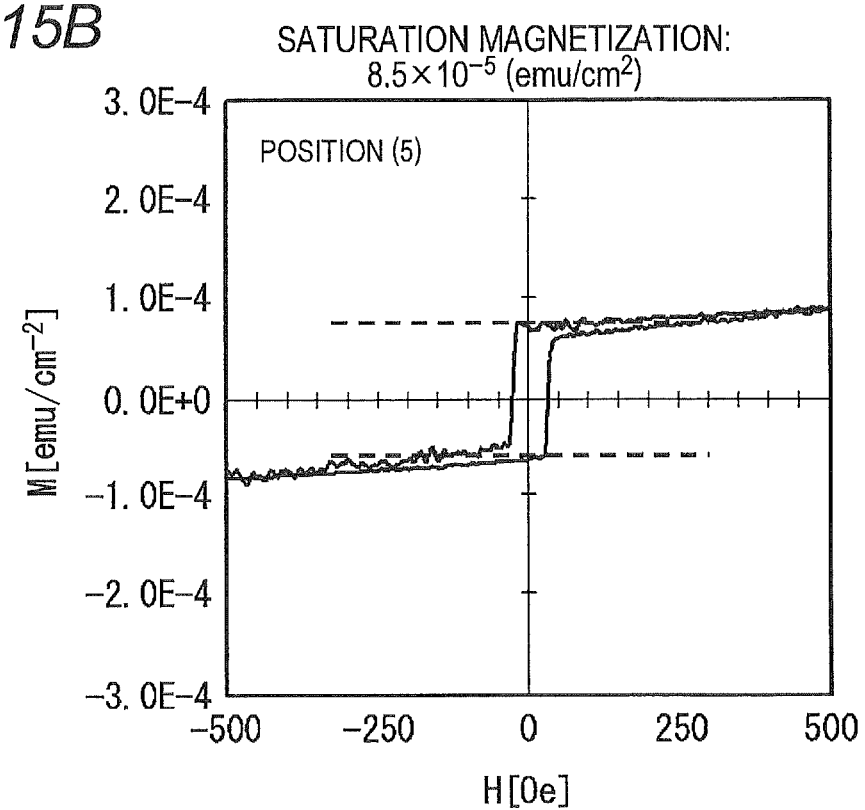
FIG. 15B is an enlarged view showing the minor loop of the magnetic memory cell etched to position (5) in FIG. 10.

FIG. 15A is an enlarged view showing the minor loop of the sample (0). FIG. 15B is an enlarged view showing the minor loop of the sample (5). Saturation magnetization is read from FIGS. 15A and 15B. The unetched sample (0) has saturation magnetization of $7.9 \times 10^{-5}$ (emu/cm$^2$) while the sample (5) has saturation magnetization of $8.5 \times 10^{-5}$ (emu/cm$^2$) where the Co/Pt laminated film 513 of the first ferromagnetic layer 51 and the second ferromagnetic layer 53 are completely removed. In other words, the Co/Pt laminated film 513 of the first ferromagnetic layer 51 and the second ferromagnetic layer 53 are completely removed, enabling satisfactory perpendicular magnetic anisotropy on the data storage layer 3 as strong as in the absence of etching.

As has been discussed, it is understood that the etching stop position of the reference layer 5 is preferably set such that the Co/Pt laminated film having in-plane magnetic anisotropy does not remain in the magnetic memory cell 1, that is, the second ferromagnetic layer 53 is completely removed and at least a part of the Co/Pt laminated film 513 is removed. Additionally, the reference layer 5 is etched to the top surface of the Ta film 512 to completely remove the Co/Pt laminated film 513, generating satisfactory perpendicular magnetic anisotropy on the data storage layer 3.

The reference layer 5 is etched to the top surface of the Ta film 512 without removing the Ta film 512, thereby effectively suppressing short circuits. The Ta film 512 is relatively oxidizable and has excellent insulating properties. In the case where the etching of the reference layer 5 is stopped without removing the Ta film 512, the top of the metallic oxide layer 7 is mainly made of a Ta oxide, thereby suppressing short circuits.

Considering that the Co/Pt laminated film exhibiting in-plane magnetic anisotropy is not left in the magnetic memory cell 1, the Ta film 512 of the first ferromagnetic layer 51 may be removed or the CoFeB film 511 under the Ta film 512 may be partially removed. However, in the case where the layer remaining on the tunnel barrier layer 4 is too thin, the data storage layer 3 may be damaged by etching so as to deteriorate the magnetic characteristics. Thus, the layer having a certain thickness is desirably left on the tunnel barrier layer 4. According to the examination of the inventors, the metallic oxide layer 7 remaining on the tunnel barrier layer 4 is preferably at least 1.0 nm in thickness.

Figure 16:
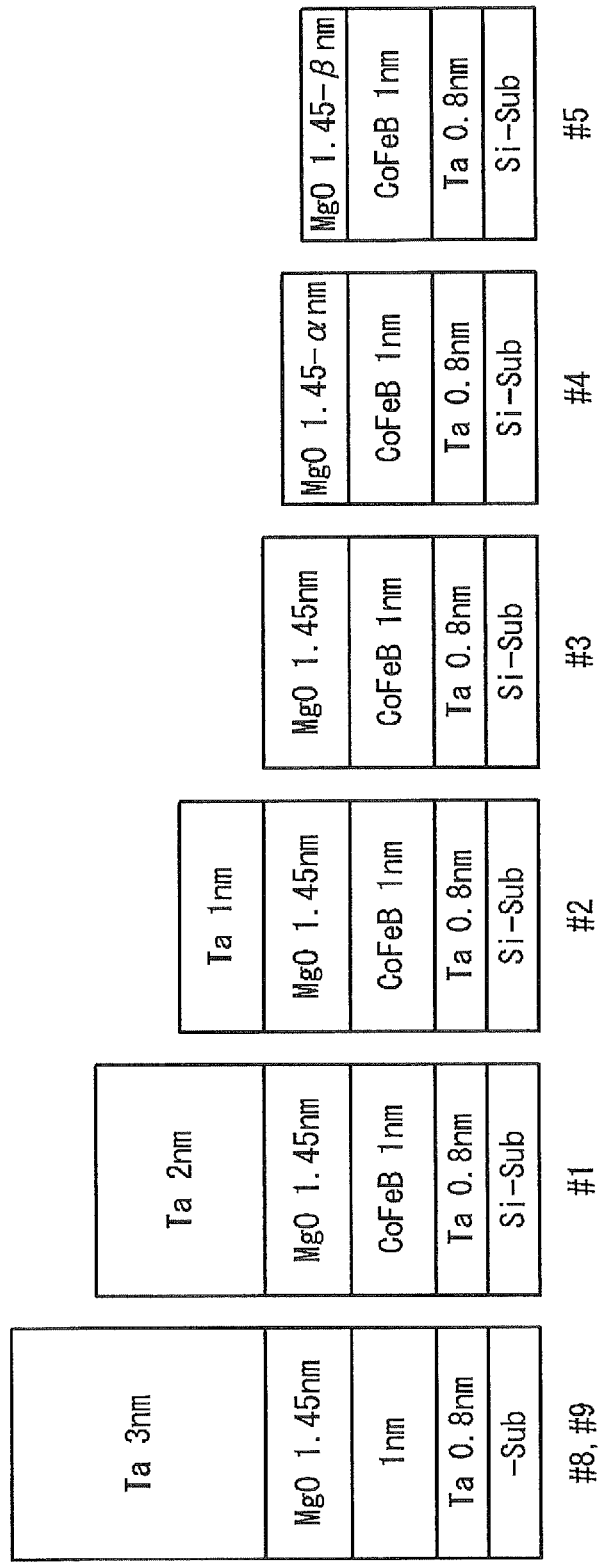
FIG. 16 is a cross-sectional view illustrating the structures of samples #1 to #5, #8, and #9 used for examining the relationship between a thickness of a layer remaining on the MgO layer and the magnetic characteristics of a CoFeB layer under the MgO layer.

The inventors have measured the MH loops of samples in FIG. 16 to examine the relationship between the thickness of the layer remaining on the tunnel barrier layer 4 and the magnetic characteristics of the data storage layer 3. In samples #8 and #9, a laminated body including a first Ta film having a thickness of 0.8 nm, a CoFeB film having a thickness of 1.0 nm, a MgO film having a thickness of 1.45 nm, and a second Ta film having a thickness of 5.0 nm is formed on a substrate. A second Ta film and a MgO film are not etched. Sample #1 is obtained by forming a laminated body on a substrate with an identical structure to samples #8 and #9, and then etching a second Ta film by 3.0 nm. In sample #1, the second Ta film remains with a thickness of 2.0 nm. Similarly, sample #2 is obtained by forming a laminated body on a substrate with an identical structure to samples #8 and #9, and then etching a second Ta film only by 4 nm. In the sample #2, the second Ta film remains with a thickness of 1.0 nm. Sample #3 is obtained by forming a laminated body on a substrate with an identical structure to samples #8 and #9, and then fully etching a second Ta film. Samples #4 and #5 are each obtained by forming a laminated body identical in structure to samples #8 and #9, etching a second Ta film, and then over-etching the film. In this case, the over-etching time of sample #5 is longer than that of sample #4, and the MgO film of sample #5 is smaller in thickness ($1.45 - \beta$ (nm)) than the MgO film of sample #4 ($1.45 - \alpha$ (nm)).

Figure 17:
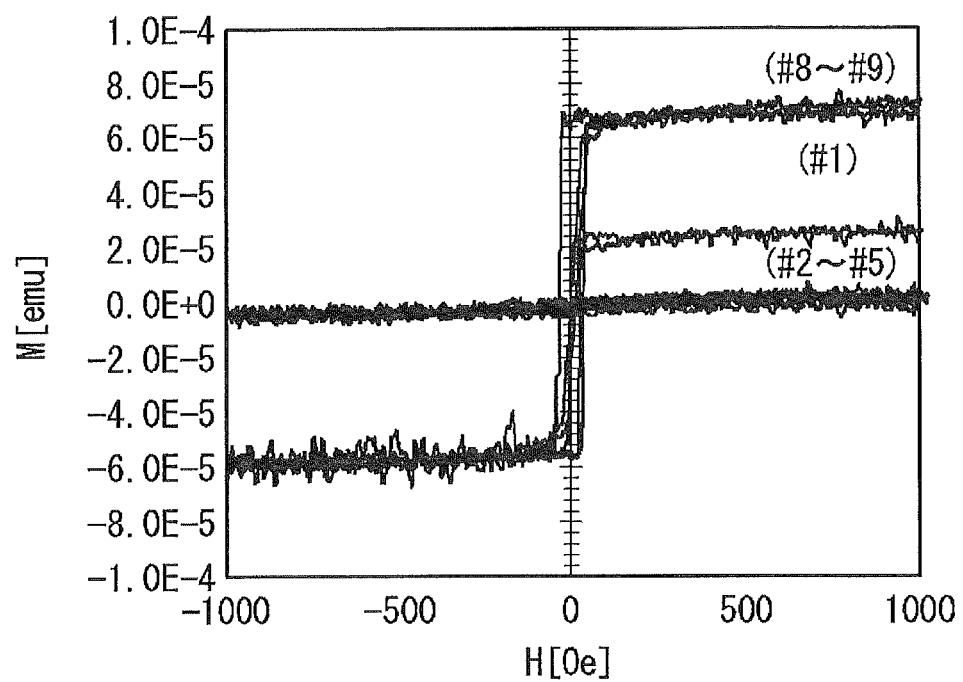
FIG. 17 is a graph showing the MH loops of the CoFeB layers in the samples #1 to #5, #8, and #9 in FIG. 16.

FIG. 17 is a graph showing the MH loops of CoFeB films in the samples illustrated in FIG. 16. In the measurements of the MH loops, a magnetic field varying between −1000 Oe and 1000 Oe is applied in the stacking direction of the first Ta film, the CoFeB film, the MgO film, and the second Ta film. As is understood from FIG. 17, no MH loop appears on sample #2 in which the second Ta film having a thickness of 1.0 nm remains on the MgO film, and samples #3 to #5 in which no film is formed on the MgO film, eliminating perpendicular magnetic anisotropy. On the sample #1 in which the second Ta film having a thickness of 2.0 nm remains on the MgO film, a MH loop is observed. This result means that the film larger than 1.0 nm is desirably left on the MgO film in consideration of the maintenance of perpendicular magnetic anisotropy. Specifically, in the magnetic memory cell 1 illustrated in FIG. 2, the metallic oxide layer 7 remaining on the tunnel barrier layer 4 desirably has a thickness greater than 1.0 nm.

As described above, in the structure and the forming process of the magnetic memory cell 1 according to the present embodiment, the metallic oxide layer 7 is left on the tunnel barrier layer 4, thereby suppressing the occurrence of short circuits between the data storage layer 3 and the reference layer 5. Furthermore, in the structure and the forming process of the magnetic memory cell 1 according to the present embodiment, damage on the data storage layer 3 can be suppressed so as to improve the magnetic characteristics of the data storage layer 3.

In the present embodiment, the first ferromagnetic layer 51 is a laminated body including the CoFeB film 511, the extremely thin Ta film 512, and the Co/Pt laminated film 513. The first ferromagnetic layer 51 may be a laminated body containing a different material. The Ta film 512 may be replaced with, for example, an extremely thin non-magnetic refractory metal film containing a different material. Alternatively, the Ta film 512 may be replaced with, for example, a W film or a Ti film. The Co/Pt laminated film 513 may be replaced with another ferromagnetic film or laminated body with perpendicular magnetic anisotropy. For example, a Co/Pt/Ni film including laminated thin Co films, Pt films, and Ni films may be used instead of the Co/Pt laminated film 513.

The non-magnetic layer 52, which is a Ru film, may be replaced with a non-magnetic metal film that antiferromagnetically couples the first ferromagnetic layer 51 and the second ferromagnetic layer 53. The second ferromagnetic layer 53, which is a Co/Pt laminated film, may be replaced with another ferromagnetic film or laminated body with perpendicular magnetic anisotropy. For example, a Co/Pt/Ni film including laminated thin Co films, Pt films, and Ni films may be used instead of the second ferromagnetic layer 53. The laminated body of the cap layer 6 may be varied in material and structure.

The above explanation described the embodiment of the magnetic memory cell of domain wall displacement in which a writing current is applied in the in-plane direction of the data storage layer. During etching of the layer formed on the tunnel barrier layer, the layer is partially left and then is oxidized so as to form the metallic oxide layer according to the method of the present embodiment. The method of the present embodiment is applicable to a typical magnetic memory cell including an island-shaped magnetic layer illustrated in FIG. 1A.

Figure 18:
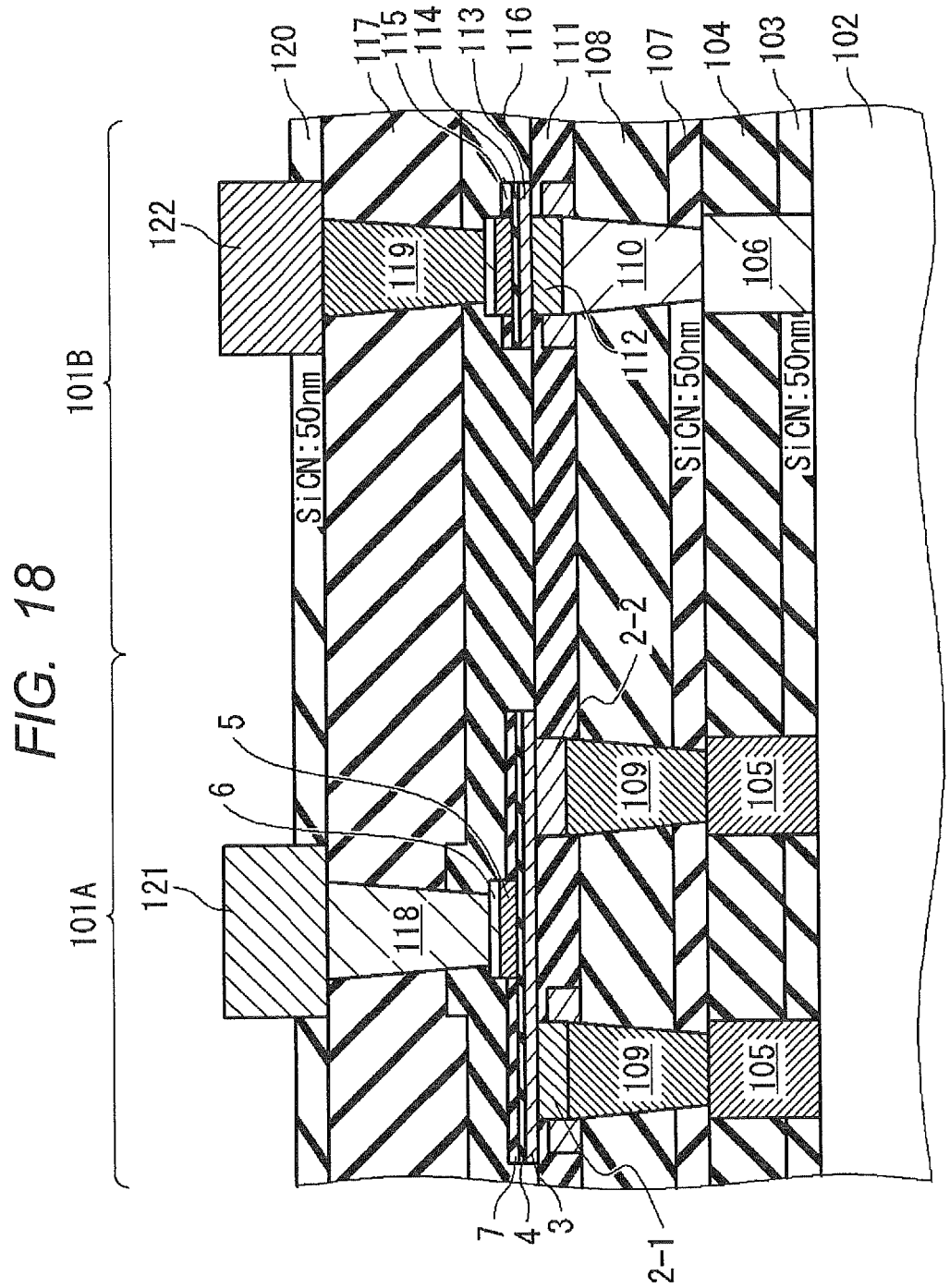
FIG. 18 is a cross-sectional view illustrating an example of the structure of a magnetic random access memory (MRAM) including the integrated magnetic memory cells according to the present embodiment.

The magnetic memory cells 1 may be integrated as MRAM memory cells. FIG. 18 is a cross-sectional view illustrating the structure of an MRAM including the integrated magnetic memory cells 1. FIG. 18 illustrates the structure of an MRAM part 101A containing the magnetic memory cell 1 and the structure of a peripheral part 101B containing a peripheral circuit.

A 50-nm SiCN film 103 is formed on a substrate 102 including integrated MOS transistors and other active elements, and then an interlayer insulating layer 104 is formed on the SiCN film 103. Furthermore, metal wires 105 and 106 embedded in the SiCN film 103 and the interlayer insulating layer 104 are provided on the substrate 102. In this case, the metal wires 105 are provided in the MRAM part 101A while the metal wire 106 is provided in the peripheral part 101B.

A SiCN film 107 and an interlayer insulating layer 108 are formed so as to cover the interlayer insulating layer 104 and the metal wires 105 and 106. Moreover, vias 109 and 110 are formed so as to penetrate the SiCN film 107 and the interlayer insulating layer 108 to the metal wires 105 and 106. The two vias 109 are provided in each of the magnetic memory cells 1.

The fixed magnetization layer 2-1 is formed on one of the vias 109 in the MRAM part 101A of the magnetic memory cell 1 while the fixed magnetization layer 2-2 is formed on the other via 109. Furthermore, a magnetic layer 112 is formed on the via 110 in the peripheral part 1013. An embedding oxide film 111 is formed on the interlayer insulating layer 108 such that the vias 109 and 110, the fixed magnetization layers 2-1 and 2-2, and the magnetic layer 112 are embedded in the embedding oxide film 111.

The data storage layer 3 and the tunnel barrier layer 4 are formed on the top surfaces of the fixed magnetization layers 2-1 and 2-2 and the embedding oxide film 111. The reference layer 5 and the cap layer 6 are sequentially formed so as to cover a part of the tunnel barrier layer 4. The metallic oxide layer 7 is formed on the tunnel barrier layer 4 without covering the reference layer 5. As described above, the magnetic memory cell 1 includes the fixed magnetization layers 2-1 and 2-2, the data storage layer 3, the tunnel barrier layer 4, the reference layer 5, the cap layer 6, and the metallic oxide layer 7.

In the peripheral part 101B, a magnetic layer 113, an insulating layer 114, and a metallic oxide layer 115 are sequentially formed on a magnetic layer 112. The magnetic layer 113, the insulating layer 114, and the metallic oxide layer 115 are constituent elements formed concurrently with the formation of the data storage layer 3, the tunnel barrier layer 4, and the metallic oxide layer 7 in the MRAM part 101A. These constituent elements do not contribute to data storage. The magnetic layer 112 and the magnetic layer 113 simply act as conductors for reducing the depth of a via hole that forms a via (via 119, will be described later) electrically coupled to the via 110.

Moreover, an embedding oxide film 116 is formed so as to cover the embedding oxide film 111, the magnetic memory cell 1, the magnetic layer 113, the insulating layer 114, and the metallic oxide layer 115. An interlayer insulating layer 117 is formed on the embedding oxide film 116. Furthermore, a via 118 is formed in the MRAM part 101A so as to penetrate the interlayer insulating layer 117 and the embedding oxide film 116 to the cap layer 6 while the via 119 is formed in the peripheral part 101B so as to penetrate the interlayer insulating layer 117, the embedding oxide film 116, the metallic oxide layer 115, and the insulating layer 114 to the cap layer. A SiCN layer 120 is formed so as to cover the interlayer insulating layer 117. Moreover, metal wires 121 and 122 are coupled to the vias 118 and 119.

Figure 19:
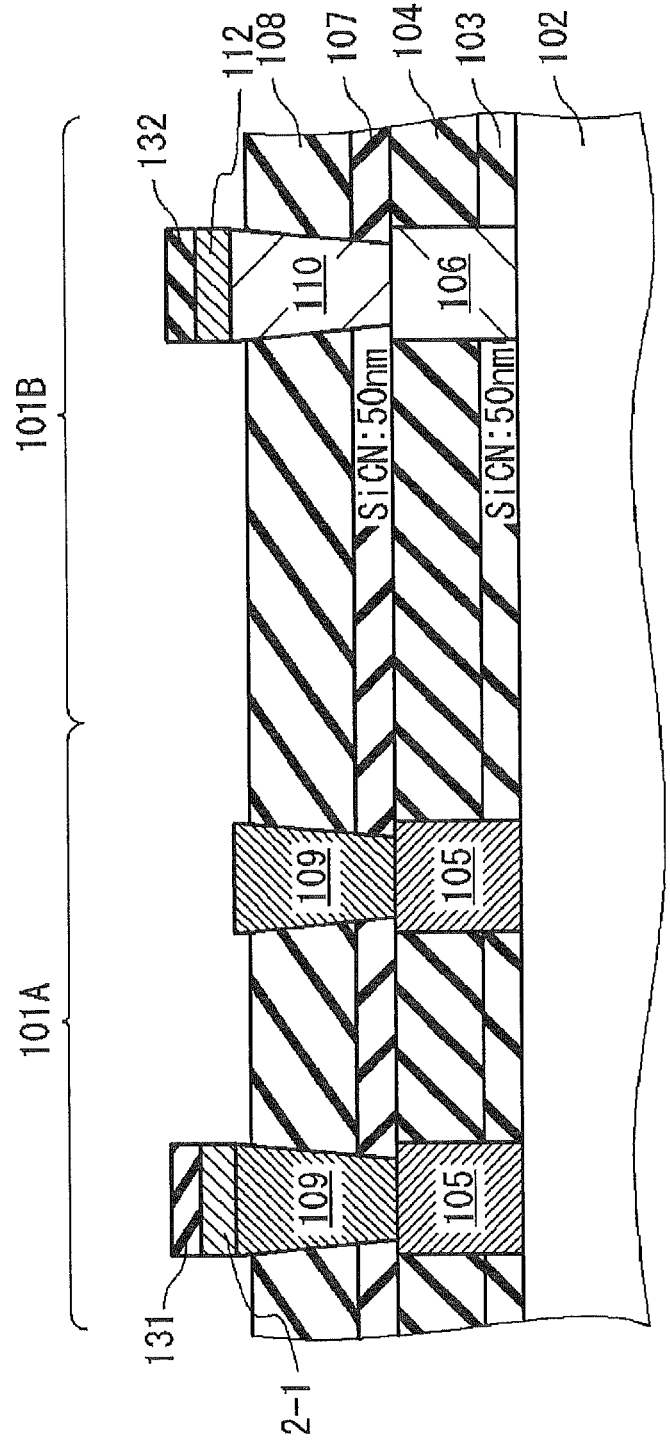
FIG. 19 is a cross-sectional view illustrating a method of manufacturing the MRAM in FIG. 18.

FIGS. 19 to 30 are cross-sectional views illustrating an example of the manufacturing process of the MRAM illustrated in FIG. 18. Referring to FIG. 19, first, the SiCN film 103 having a thickness of 50 nm is formed on the substrate 102 including integrated MOS transistors and other active elements, and then the interlayer insulating layer 104 is formed on the SiCN film 103. Moreover, the metal wires 105 and 106 are embedded into grooves provided on the SiCN film 103 and the interlayer insulating layer 104.

The SiCN film 107 is formed so as to cover the interlayer insulating layer 104 and the metal wires 105 and 106, and then the interlayer insulating layer 108 is formed on the SiCN film 107. Furthermore, the vias 109 and 110 are formed so as to penetrate the SiCN film 107 and the interlayer insulating layer 108. The via 109 reaches the metal wire 105 in the MRAM part 101A while the via 110 reaches the metal wire 106 in the peripheral part 101B.

Moreover, the ferromagnetic film to be processed into the fixed magnetization layer 2-1 in the subsequent step is formed so as to cover the entire surface of the interlayer insulating layer 108. Furthermore, hard masks 131 and 132 are formed on the ferromagnetic film. The ferromagnetic film is etched into the fixed magnetization layer 2-1 on the via 109 and the magnetic layer 112 on the via 110 by using the hard masks 131 and 132.

Figure 20:
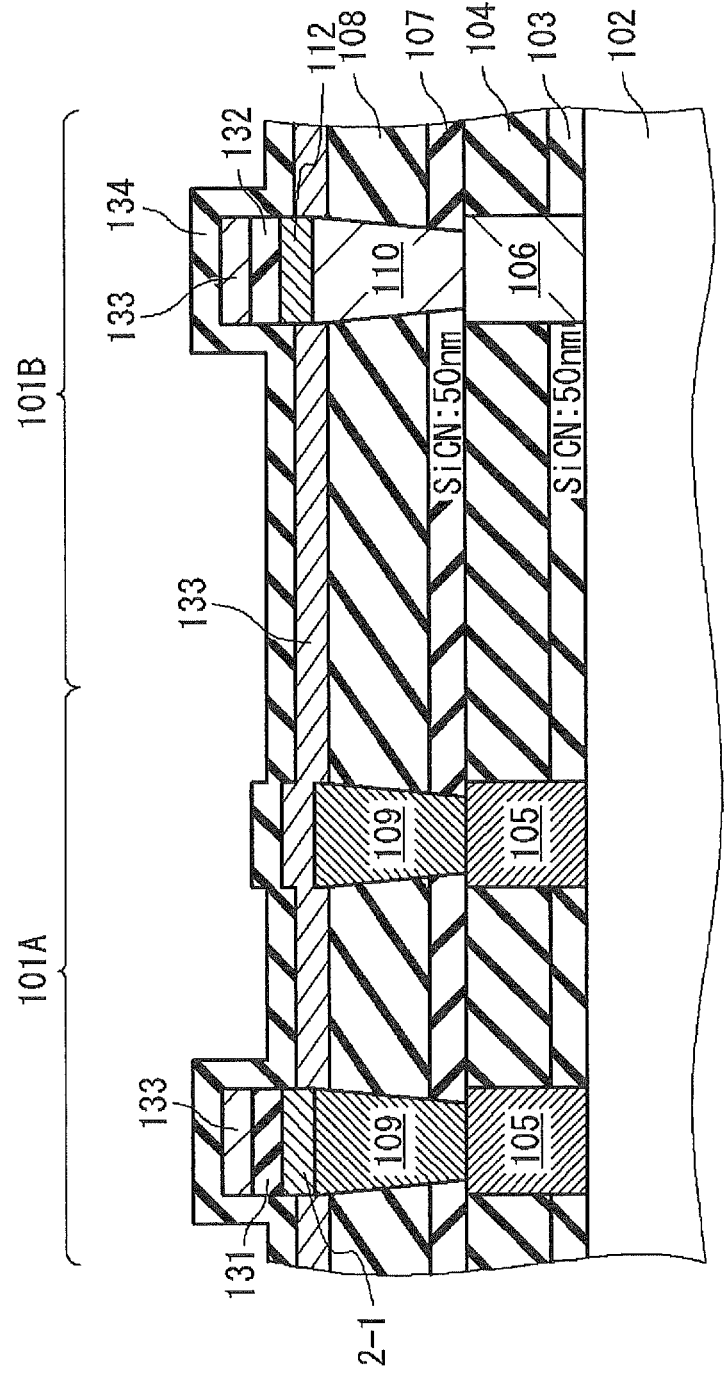
FIG. 20 is a cross-sectional view illustrating the method of manufacturing the MRAM in FIG. 18.
Figure 21:
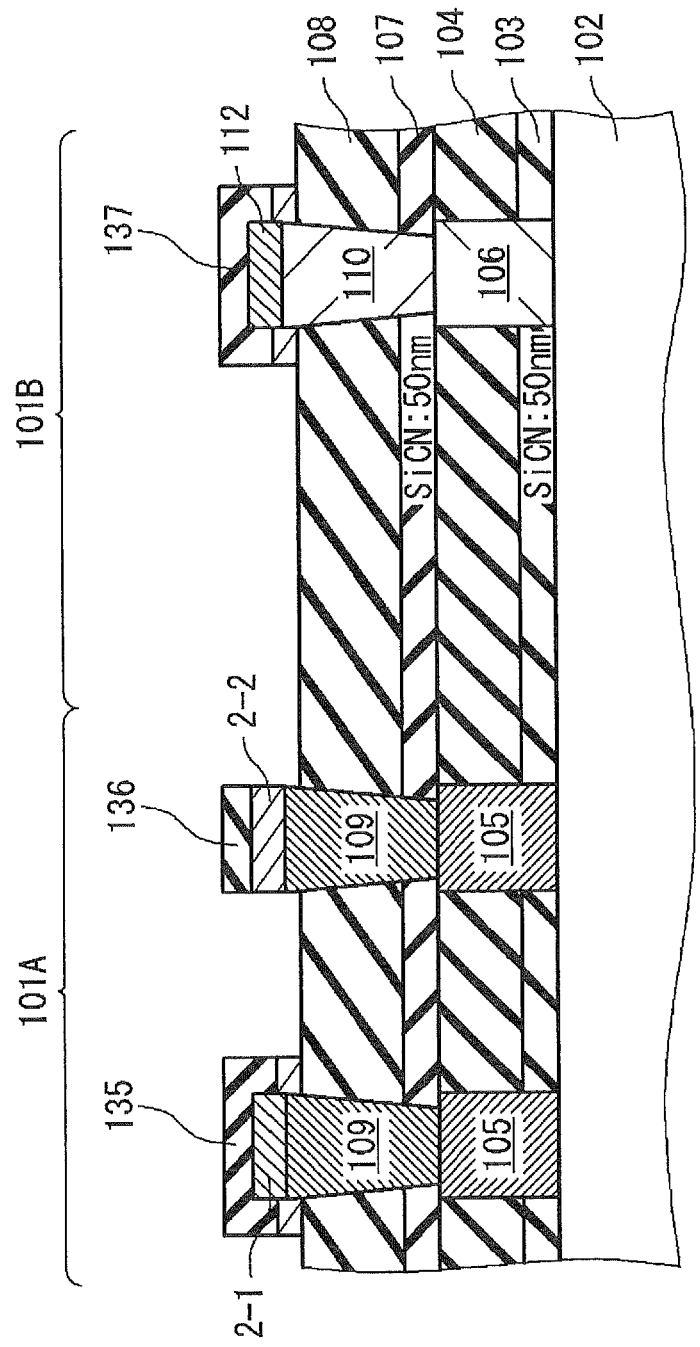
FIG. 21 is a cross-sectional view illustrating the method of manufacturing the MRAM in FIG. 18.

Subsequently, as illustrated in FIG. 20, a ferromagnetic film 133 to be processed into the fixed magnetization layer 2-2 in the subsequent step and an insulating film 134 acting as a hard mask in the subsequent step are stacked so as to cover the entire surface. After that, as illustrated in FIG. 21, the insulating film 134 is patterned into a hard mask 136. The ferromagnetic film 133 is etched into the fixed magnetization layer 2-2 by using the hard mask 136. In FIG. 21, reference numerals 135 and 137 denote insulating films that include the hard masks 131 and 132 left in the preceding step and a part of the insulating film 134 left in the patterning of the hard mask 136 and the fixed magnetization layer 2-2.

Figure 22:
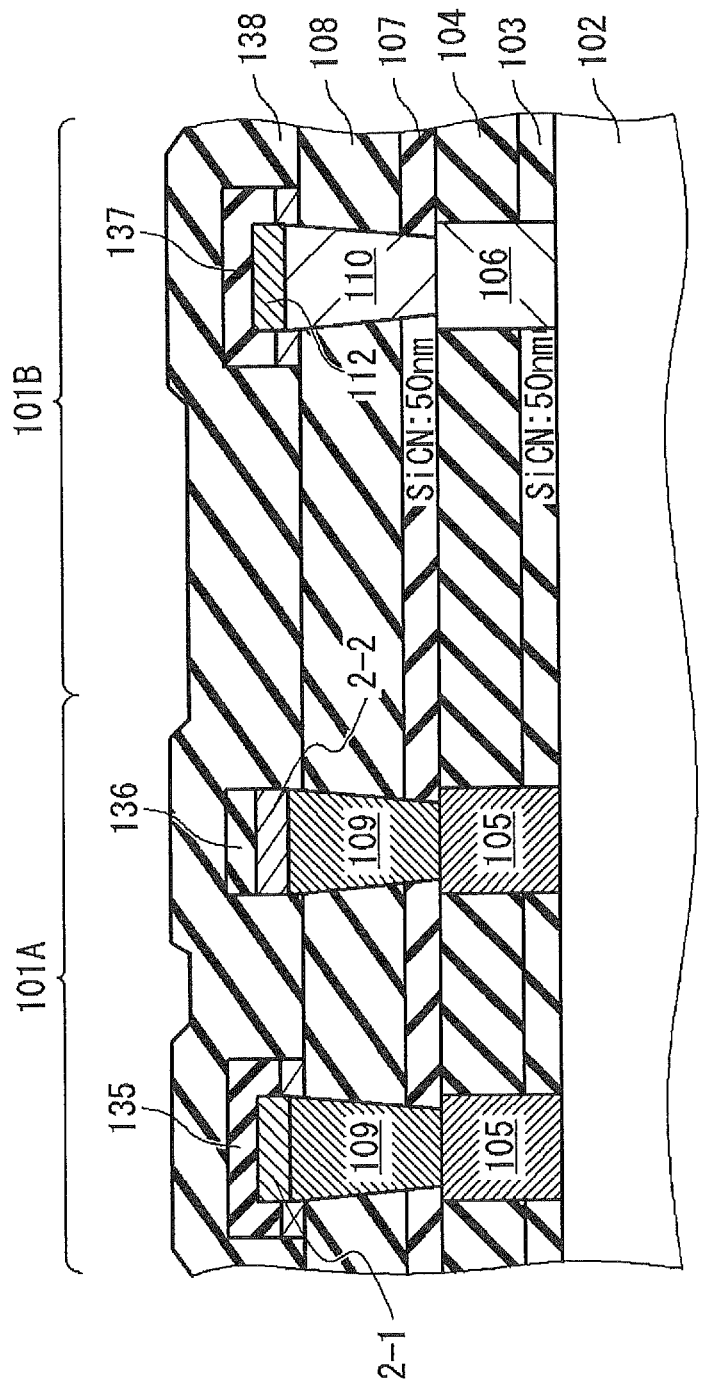
FIG. 22 is a cross-sectional view illustrating the method of manufacturing the MRAM in FIG. 18.
Figure 23:
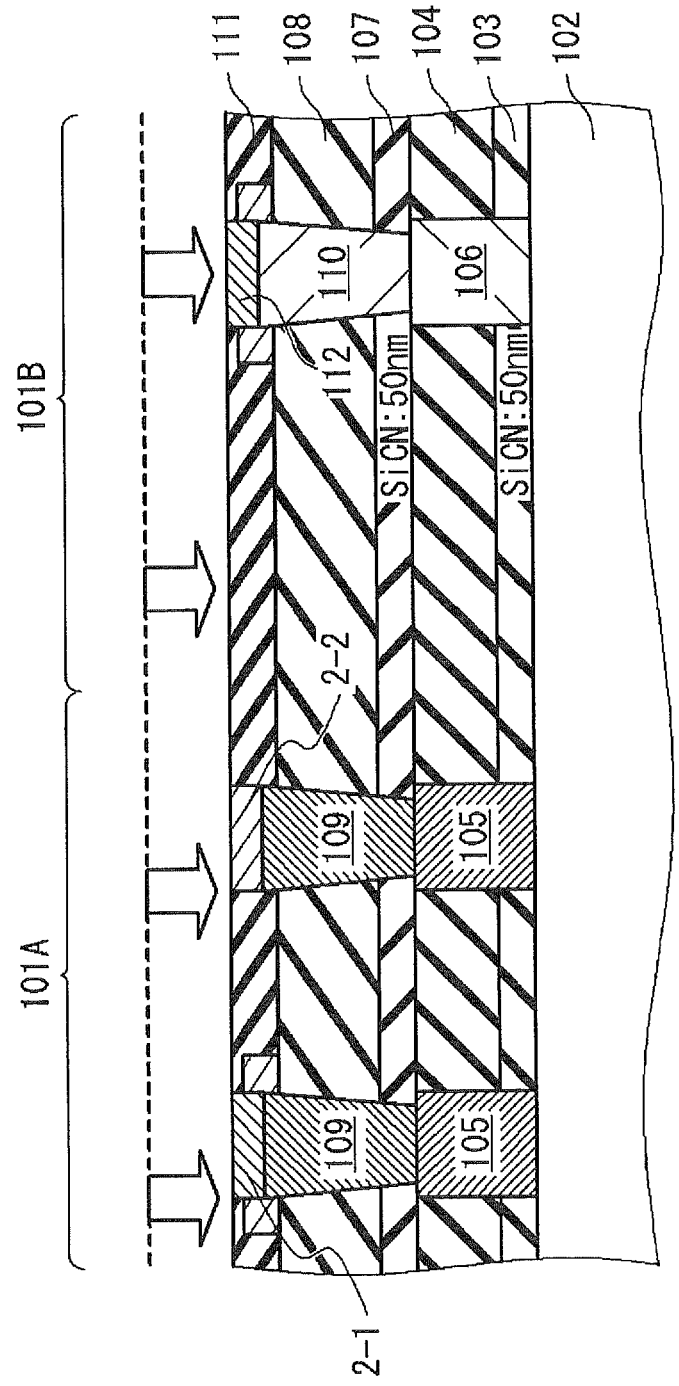
FIG. 23 is a cross-sectional view illustrating the method of manufacturing the MRAM in FIG. 18.

Subsequently, as illustrated in FIG. 22, a silicon oxide film 138 covering the fixed magnetization layers 2-1 and 2-2 and the magnetic layer 112 is formed on the entire surface. Then, as illustrated in FIG. 23, the silicon oxide film 138 is etched back so as to expose the fixed magnetization layers 2-1 and 2-2 and the top surface of the magnetic layer 112, forming the embedding oxide film 111.

Figure 24:
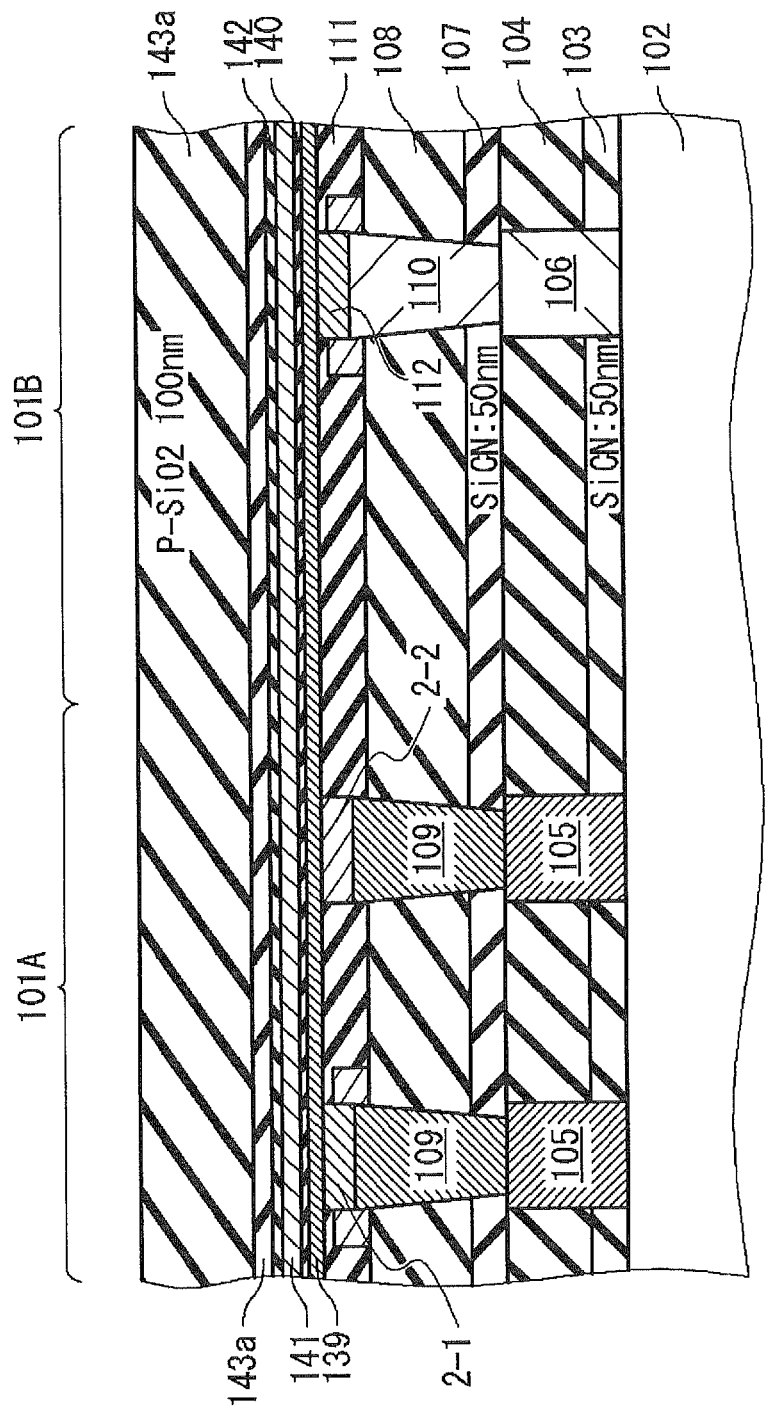
FIG. 24 is a cross-sectional view illustrating the method of manufacturing the MRAM in FIG. 18.

Subsequently, as illustrated in FIG. 24, a magnetic film 139, an insulating film 140, a magnetic film 141, a conductive film 142, a silicon nitride film 143a, and a silicon oxide film 143b are sequentially stacked on the embedding oxide film 111. In this configuration, the magnetic film 139 is a film (or a film stack) to be processed into the data storage layer 3 in the subsequent step, while the insulating film 140 is a film to be processed into the tunnel barrier layer 4 in the subsequent step. The magnetic film 141 is a film (or a film stack) to be processed into the reference layer 5 in the subsequent step while the conductive film 142 is a film to be processed into the cap layer 6 in the subsequent step. In the formation of the magnetic memory cell 1 having the structure of FIG. 5, the insulating film 140 is a thin MgO film, the magnetic film 141 is a laminated body including a CoFeB film, a Ta film, a first Co/Pt laminated film, a Ru film, and a second Co/Pt laminated film, and the conductive film 142 is a laminated body including a first Pt film, a first Ru film, a second Pt film, a second Ru film, and a Ta film.

Figure 25:
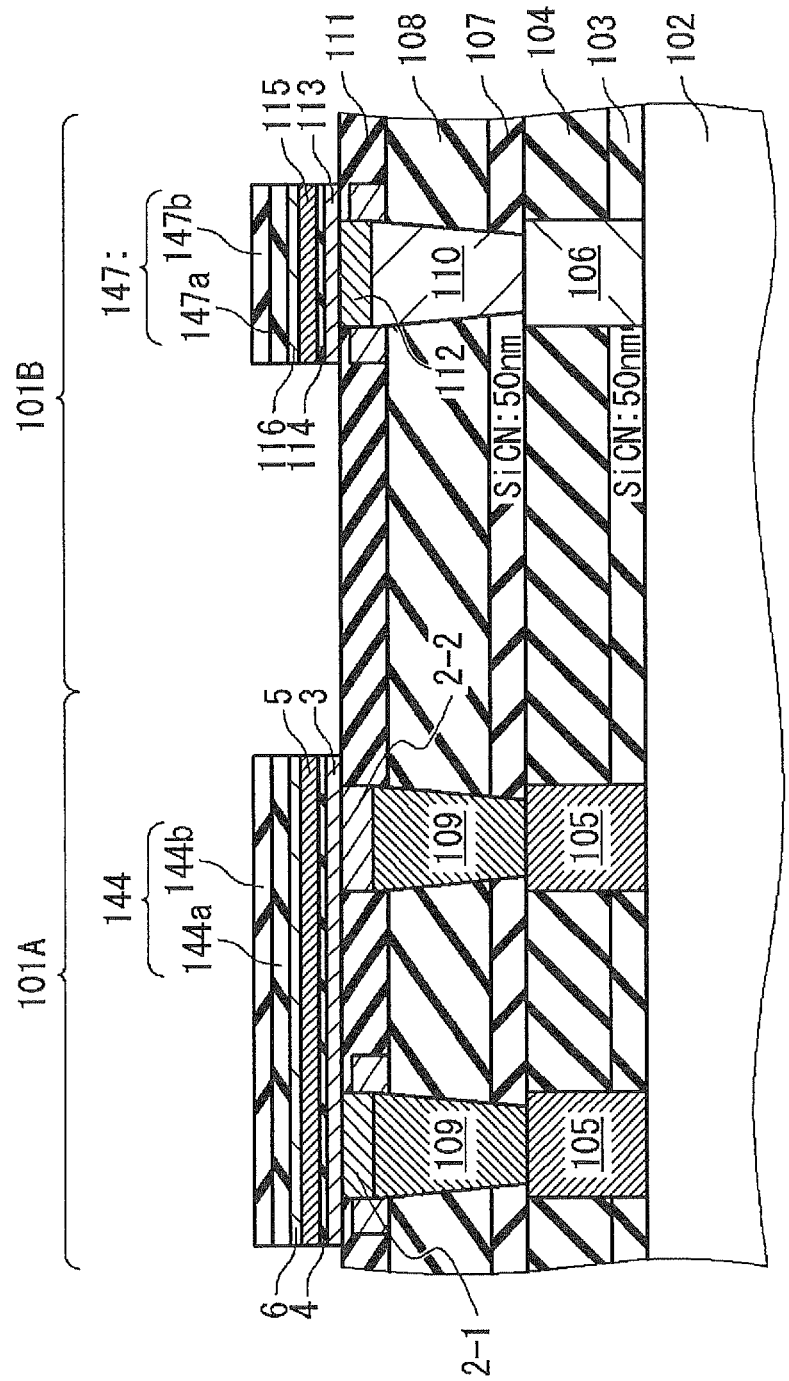
FIG. 25 is a cross-sectional view illustrating the method of manufacturing the MRAM in FIG. 18.

As illustrated in FIG. 25, the silicon oxide film 143b is etched back, and then the silicon nitride films 143a, and the silicon oxide film 143b are patterned into hard masks 144 and 147. The hard mask 144 is a laminated film including a silicon nitride film 144a and a silicon oxide film 144b while the hard mask 147 is a laminated film including a silicon nitride film 147a and a silicon oxide film 147b. Furthermore, the conductive film 142, the magnetic film 141, the insulating film 140, and the magnetic film 139 are etched with the hard masks 144 and 147 into the data storage layer 3, the tunnel barrier layer 4, the reference layer 5, the cap layer 6, the magnetic layer 113, the insulating layer 114, a magnetic layer 145, and a conductive layer 146.

Figure 26:
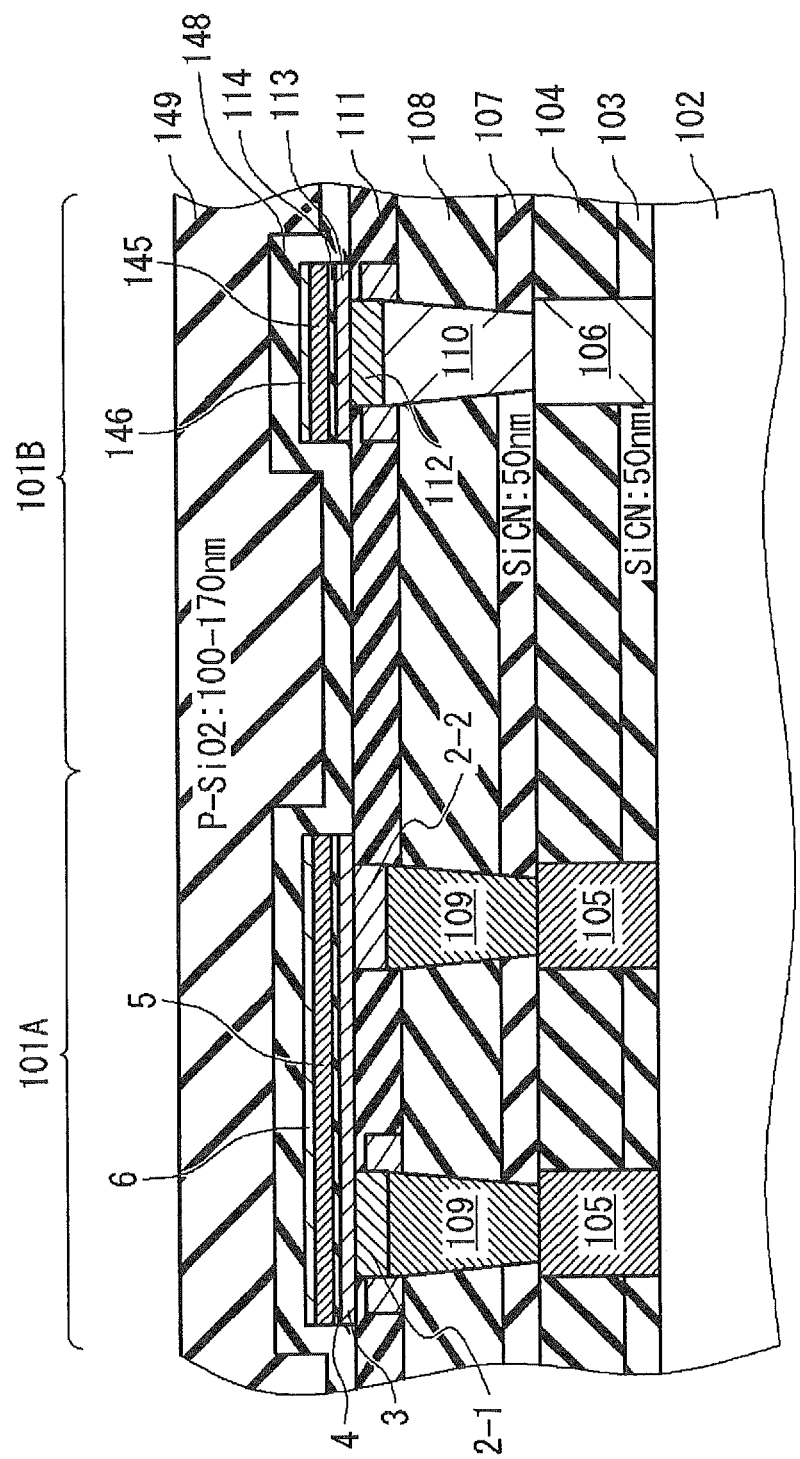
FIG. 26 is a cross-sectional view illustrating the method of manufacturing the MRAM in FIG. 18.

Subsequently, the reference layer 5 and the cap layer 6 are patterned. Specifically, as illustrated in FIG. 26, a silicon nitride film 148 having a thickness of, for example, 30 nm is formed so as to cover the entire surface, and then a silicon oxide film 149 is formed on the silicon nitride film 148. After that, the top surface of the silicon oxide film 149 is flattened by polishing.

Figure 27:
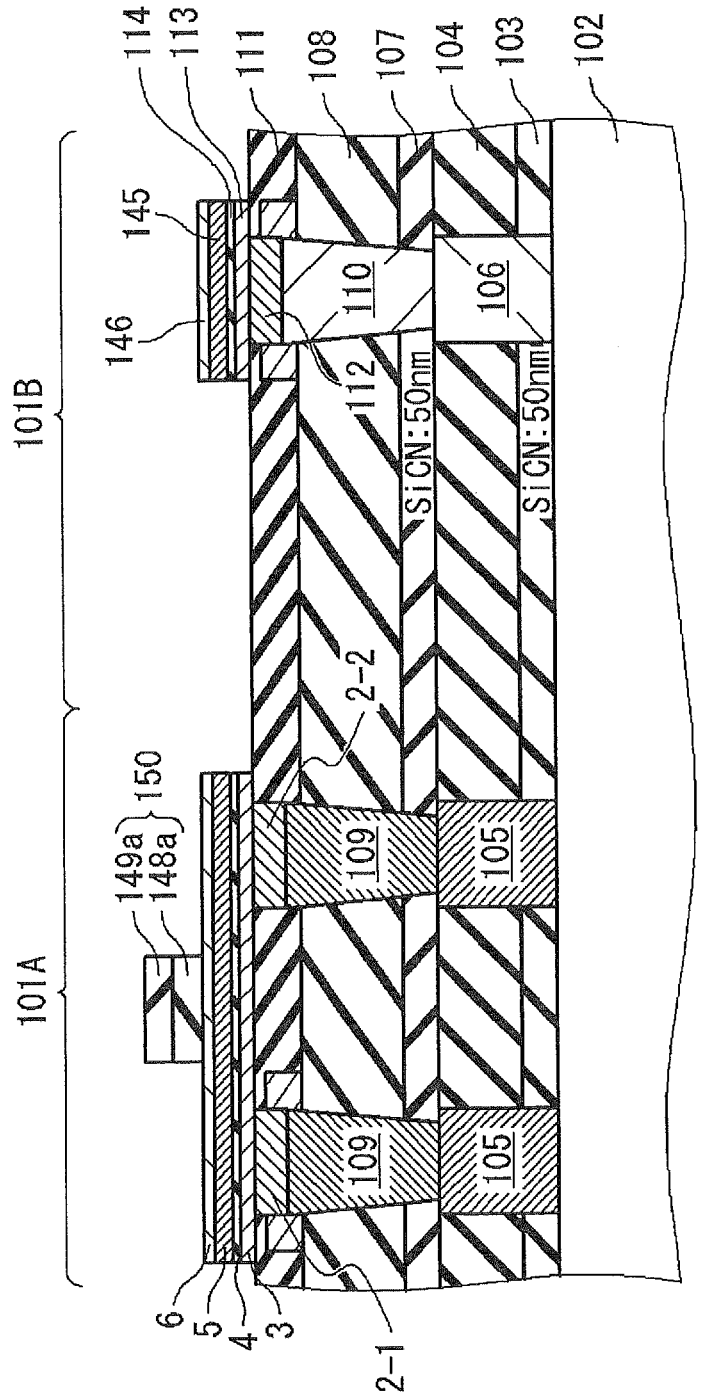
FIG. 27 is a cross-sectional view illustrating the method of manufacturing the MRAM in FIG. 18.

As illustrated in FIG. 27, the silicon oxide film 149 is etched back, and then the silicon nitride film 148 and the silicon oxide film 149 are patterned. Thus, in the MRAM part 101A, a hard mask 150 including a silicon nitride film 148a and a silicon oxide film 149a is formed on the laminated body including the data storage layer 3, the tunnel barrier layer 4, the reference layer 5, and the cap layer 6.

Figure 28:
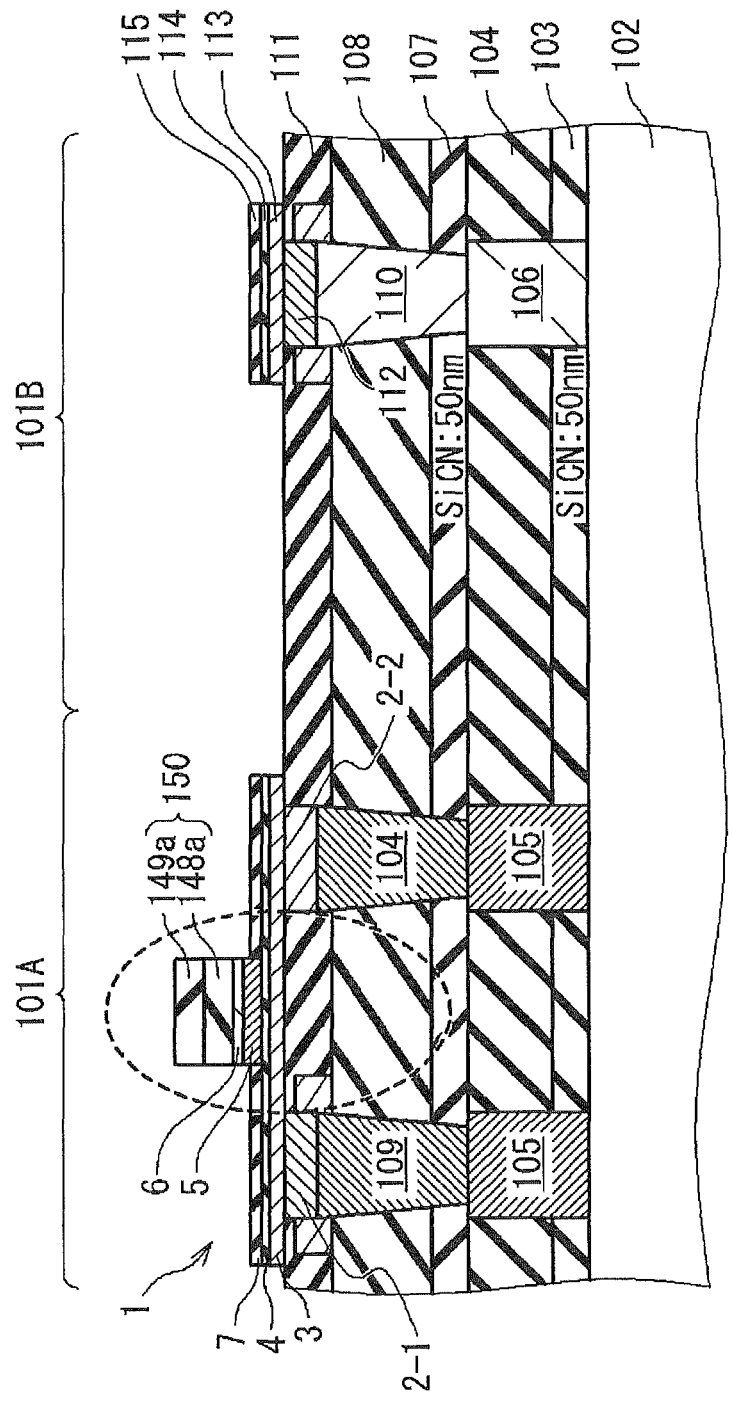
FIG. 28 is a cross-sectional view illustrating the method of manufacturing the MRAM in FIG. 18.

Subsequently, as illustrated in FIG. 28, the cap layer 6 and the reference layer 5 are partially etched into a desired pattern by using the hard mask 150. The conditions and steps of etching the reference layer 5 and the cap layer 6 are identical to those of FIGS. 7A to 7C. The Ta film 65 of the cap layer 6 is etched with chlorine gas used as etching gas, and then the remaining part of the cap layer 6 and a part of the reference layer 5 are etched with alcohol etching gas (e.g., $CH_3OH$). During the etching process, the reference layer is partially left (most preferably, the CoFeB film 511 and the Ta film 512) while the remaining part is oxidized by alcohol etching gas to form the metallic oxide layer 7.

During etching on the cap layer 6 and the reference layer 5, the conductive layer 146 and the magnetic layer 145 are etched in the peripheral part 101B. Since the etching process leaves a part of the reference layer 5, the magnetic layer 145 is partially left and the remaining part of the layer is oxidized to form the metallic oxide layer 115.

Figure 29:
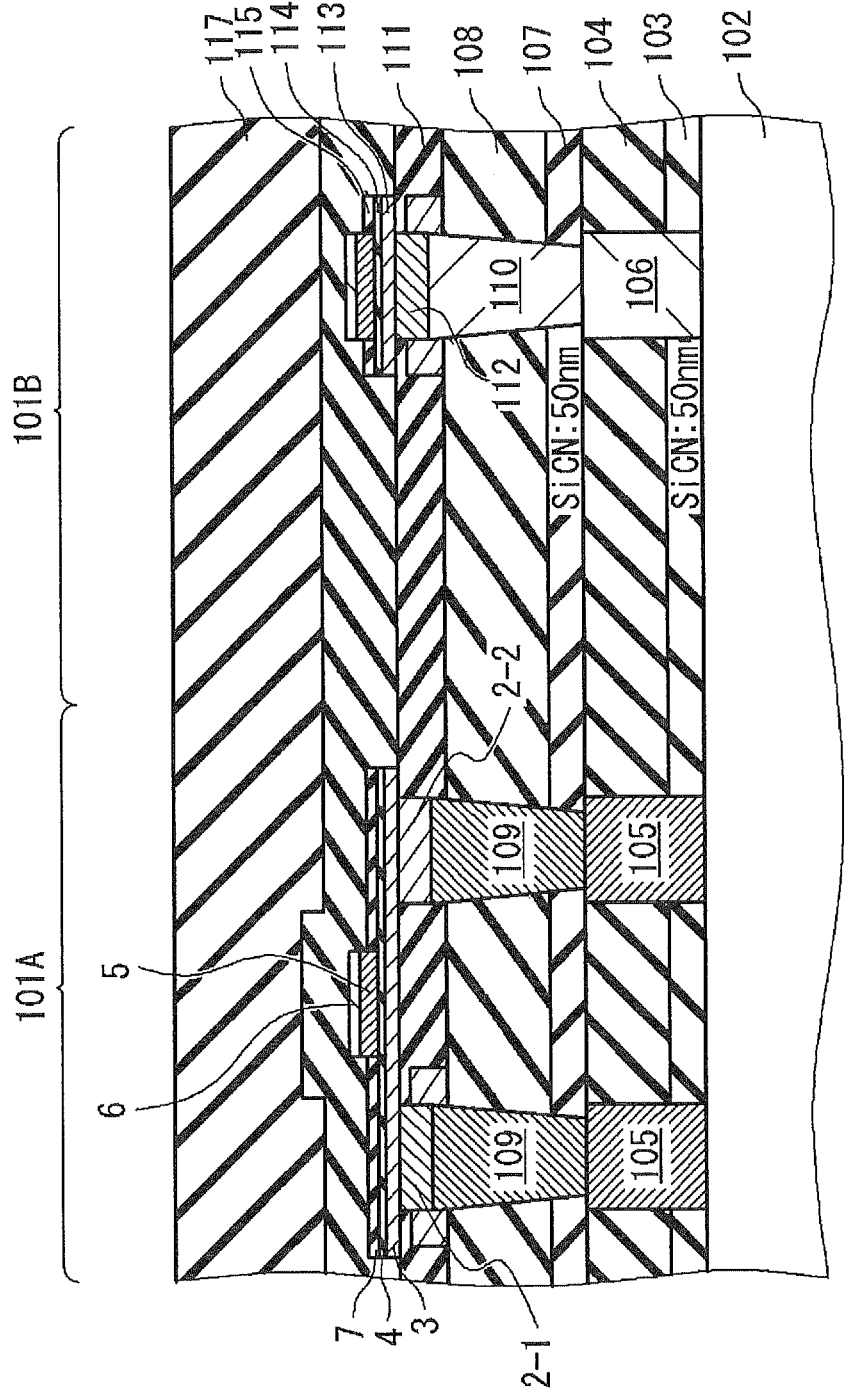
FIG. 29 is a cross-sectional view illustrating the method of manufacturing the MRAM in FIG. 18.
Figure 30:
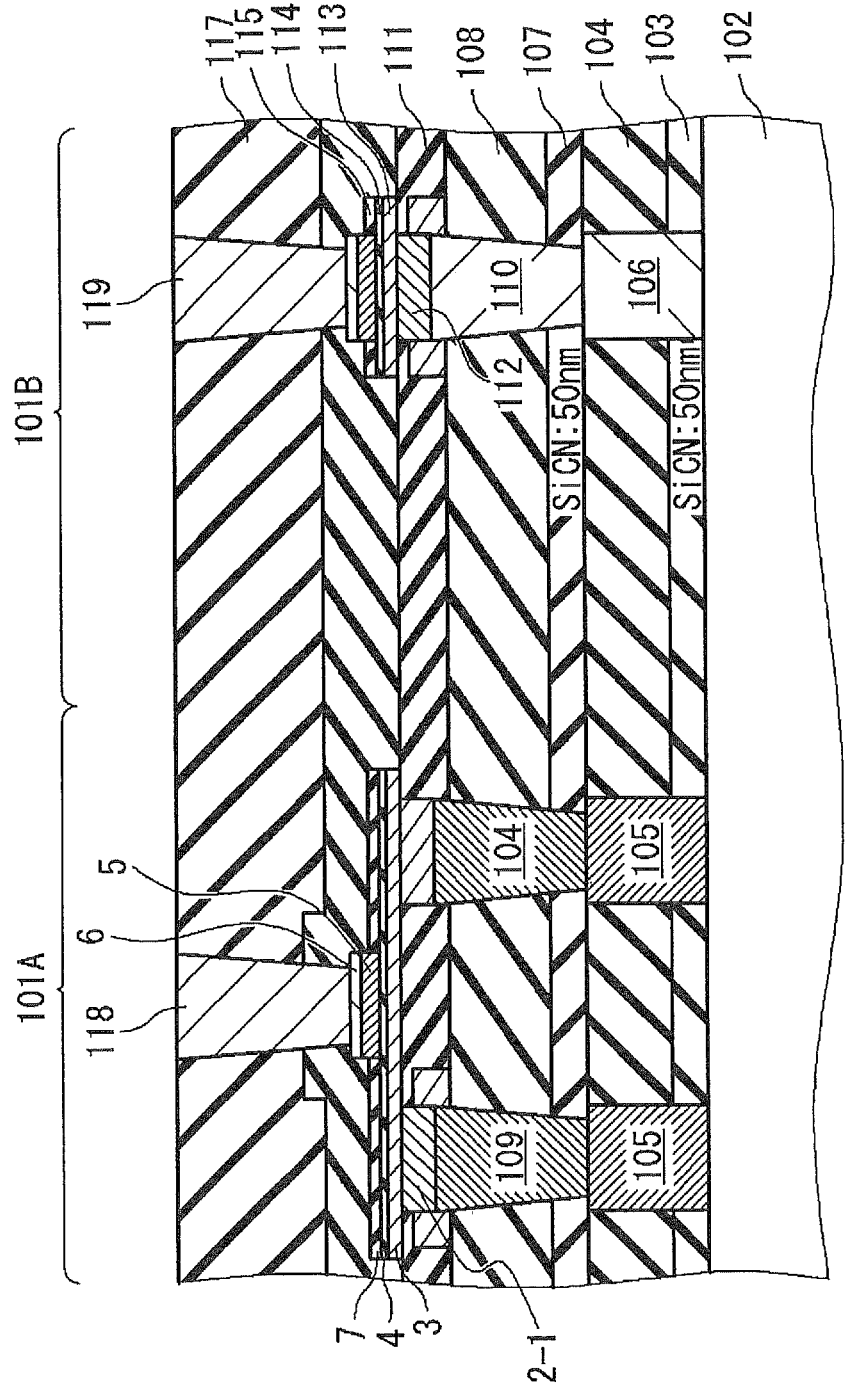
FIG. 30 is a cross-sectional view illustrating the method of manufacturing the MRAM in FIG. 18.

Subsequently, as illustrated in FIG. 29, the entire surface is covered with the embedding oxide film 116, and then the interlayer insulating layer 117 is formed on the embedding oxide film 116. Furthermore, as illustrated in FIG. 30, the MRAM part 101A has a via 118 penetrating the interlayer insulating layer 117 and the embedding oxide film 116 to the cap layer 6 while the peripheral part 101B has a via 119 penetrating the interlayer insulating layer 117, the embedding oxide film 116, the metallic oxide layer 115, and the insulating layer 114 to the cap layer. After the SiCN layer 120 is formed so as to cover the entire surface, the metal wires 121 and 122 are formed, completing the manufacturing of the MRAM illustrated in FIG. 18.

An invention implemented according to the present invention has been described in detail with reference to the embodiment. It is obvious that the present invention is not limited to the embodiment and thus may be modified in various ways without departing from the scope of the invention.

What is claimed is:

1. A magnetic memory cell comprising:
    a fixed magnetization layer;
    a first magnetic layer including a fixed magnetization area formed on a surface of the fixed magnetization layer and having a magnetization which is fixed in the same direction as the fixed magnetization layer;
    a tunnel barrier layer formed over the first magnetic layer;
    a second magnetic layer formed over the tunnel barrier layer so as to partially cover the tunnel barrier layer, the second magnetic layer comprising a magnetic layer and a first non-magnetic layer; and
    a metallic oxide layer formed on an upper surface of the tunnel barrier layer such that the tunnel barrier layer is formed between the metallic oxide layer and the fixed magnetization layer, the metallic oxide layer including an oxidized part of the magnetic layer and the first non-magnetic layer.

2. The magnetic memory cell according to claim 1, wherein the tunnel barrier layer comprises a MgO layer,
    wherein the magnetic layer of the second magnetic layer includes a CoFeB layer formed over the tunnel barrier layer,
    wherein the first non-magnetic layer comprises an intermediate layer formed over the CoFeB layer,
    wherein the second magnetic layer further comprises a perpendicularly magnetized layer that is formed over the intermediate layer and exhibits perpendicular magnetic anisotropy, and
    wherein the metallic oxide layer comprises an oxide obtained by oxidizing CoFeB and an oxide obtained by oxidizing the intermediate layer.

3. The magnetic memory cell according to claim 1, wherein the metallic oxide layer has a thickness greater than 1.0 nm.

4. The magnetic memory cell according to claim 2, wherein the intermediate layer comprises a Ta film.

5. The magnetic memory cell according to claim 2, wherein the metallic oxide layer includes no oxide of a material of the perpendicularly magnetized layer.

6. A magnetic random access memory comprising the magnetic memory cell according to claim 1.

7. The magnetic memory cell according to claim 1, wherein the first magnetic layer comprises a data storage layer which stores data as a direction of magnetization.

8. The magnetic memory cell according to claim 1,
    wherein the first magnetic layer further comprises:
        a reversible magnetization area formed outside the surface of the fixed magnetization layer.

9. The magnetic memory cell according to claim 8, wherein the second magnetic layer is formed over the reversible magnetization area of the first magnetic layer.

10. The magnetic memory cell according to claim 1, wherein the second magnetic layer further comprises:
    a first perpendicularly magnetized layer formed on the first non-magnetic layer and exhibiting perpendicular magnetic anisotropy;
    a second non-magnetic layer formed on the first perpendicularly magnetized layer; and
    a second perpendicularly magnetized layer formed on the second non-magnetic layer.

11. A magnetic memory cell comprising:
a fixed magnetization layer;
a first magnetic layer including a fixed magnetization area formed on a surface of the fixed magnetization layer and having a magnetization which is fixed in the same direction as the fixed magnetization layer;
a tunnel barrier layer formed on the first magnetic layer;
a second magnetic layer formed on a surface of the tunnel barrier layer, the second magnetic layer comprising a magnetic layer and a non-magnetic metal layer; and
a metallic oxide layer formed on the surface of the tunnel barrier layer and on opposing sides of the magnetic layer and the non-magnetic metal layer such that the tunnel barrier layer is formed between the metallic oxide layer and the fixed magnetization layer, the metallic oxide layer including an oxidized part of the magnetic layer and the non-magnetic metal layer.

* * * * *